(12) United States Patent
Ootorii et al.

(10) Patent No.: US 11,370,047 B2
(45) Date of Patent: Jun. 28, 2022

(54) METHOD OF MANUFACTURING MOUNTING SUBSTRATE AND METHOD OF MANUFACTURING ELECTRONIC APPARATUS

(71) Applicant: Sony Corporation, Tokyo (JP)

(72) Inventors: Hiizu Ootorii, Kanagawa (JP); Kiwamu Adachi, Kanagawa (JP); Takeshi Mizuno, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/270,762

(22) Filed: May 6, 2014

(65) Prior Publication Data

US 2014/0339289 A1    Nov. 20, 2014

(30) Foreign Application Priority Data

May 16, 2013    (JP) .............................. JP2013-104225

(51) Int. Cl.
  *H01L 23/00*    (2006.01)
  *B23K 1/20*    (2006.01)
  *H05K 13/04*    (2006.01)

(52) U.S. Cl.
  CPC ................ *B23K 1/20* (2013.01); *H01L 24/95* (2013.01); *H05K 13/0469* (2013.01); *H01L 2224/16225* (2013.01); *H01L 2924/12041* (2013.01); *H01L 2924/12042* (2013.01); *H01L 2924/12043* (2013.01); *H01L 2924/15788* (2013.01)

(58) Field of Classification Search
  CPC ....... B23K 1/203; B23K 1/20; H05K 13/0465

USPC ..................................................... 228/180.22
  See application file for complete search history.

(56) References Cited

U.S. PATENT DOCUMENTS

| | | | | |
|---|---|---|---|---|
| 5,137,936 A | * | 8/1992 | Akiguchi ................. | C09D 4/06 |
| | | | | 522/170 |
| 5,447,886 A | * | 9/1995 | Rai ......................... | H01L 24/81 |
| | | | | 228/180.22 |
| 5,668,058 A | * | 9/1997 | Tanioka .................. | H01L 24/75 |
| | | | | 438/108 |
| 5,695,109 A | * | 12/1997 | Chiang .............. | B23K 35/0222 |
| | | | | 101/127 |
| 5,704,116 A | * | 1/1998 | Gamota ............. | B23K 35/3612 |
| | | | | 228/180.22 |

(Continued)

FOREIGN PATENT DOCUMENTS

| | | |
|---|---|---|
| JP | 05-041597 | 2/1993 |
| JP | 10-090688 | 4/1998 |

(Continued)

*Primary Examiner* — Erin B Saad
*Assistant Examiner* — Carlos J Gamino
(74) *Attorney, Agent, or Firm* — K&L Gates LLP

(57) ABSTRACT

A method of manufacturing a mounting substrate, the method includes: transferring part or all of a plurality of devices on a device substrate onto a wiring substrate, and temporarily fixing the transferred devices to the wiring substrate with use of a fixing layer having viscosity, the device substrate including a support substrate and the plurality of devices fixed on the support substrate; and performing a reflow process on the wiring substrate to electrically connect the transferred devices with the wiring substrate, and thereby forming the mounting substrate.

5 Claims, 26 Drawing Sheets

(56) References Cited

U.S. PATENT DOCUMENTS

| | | | | |
|---|---|---|---|---|
| 5,722,160 | A * | 3/1998 | Uemura | H01L 24/73 228/180.1 |
| 5,828,128 | A * | 10/1998 | Higashiguchi | H01L 23/49816 257/738 |
| 5,930,889 | A * | 8/1999 | Klein | H01L 24/81 228/180.21 |
| 5,985,043 | A * | 11/1999 | Zhou | B23K 35/025 148/24 |
| 6,059,172 | A * | 5/2000 | Chapman | B23K 35/0244 228/180.22 |
| 6,117,759 | A * | 9/2000 | Greer | H01L 21/4853 228/180.22 |
| 6,122,177 | A * | 9/2000 | Kitano | H01L 23/49816 228/180.22 |
| 6,136,047 | A * | 10/2000 | Karasawa | H01L 24/11 257/737 |
| 6,723,629 | B2 * | 4/2004 | Hotchkiss | H01L 21/4839 228/180.21 |
| 6,769,469 | B2 * | 8/2004 | Yamada | H01L 21/563 156/556 |
| 7,413,110 | B2 * | 8/2008 | Goudarzi | B23K 1/0016 228/226 |
| 7,455,213 | B2 * | 11/2008 | Nishiyama | H01L 21/6835 228/180.22 |
| 7,632,710 | B2 * | 12/2009 | Sakai | H05K 3/3484 257/738 |
| 7,735,713 | B2 * | 6/2010 | Kataoka | H01L 24/81 228/164 |
| 7,870,991 | B2 * | 1/2011 | Okamoto | H05K 3/3436 228/103 |
| 7,939,939 | B1 * | 5/2011 | Zeng | B23K 1/0016 228/180.22 |
| 8,067,835 | B2 * | 11/2011 | Kida | H01L 24/16 228/180.22 |
| 8,381,965 | B2 * | 2/2013 | Jang | H01L 24/16 228/180.22 |
| 8,444,043 | B1 * | 5/2013 | Bernier | H01L 23/49816 228/179.1 |
| 8,770,462 | B2 * | 7/2014 | Beair | B23K 3/0638 228/207 |
| 8,960,526 | B2 * | 2/2015 | Maeda | B23K 35/0244 228/207 |
| 2002/0185309 | A1 * | 12/2002 | Imamura | H01L 24/81 174/261 |
| 2003/0096453 | A1 * | 5/2003 | Wang | H01L 21/563 438/108 |
| 2007/0145101 | A1 * | 6/2007 | Kataoka | H01L 23/49838 228/101 |
| 2007/0194432 | A1 * | 8/2007 | Hsu | H01L 23/49822 257/698 |
| 2010/0101845 | A1 * | 4/2010 | Kishi | B23K 1/0016 174/259 |
| 2010/0258543 | A1 * | 10/2010 | Mizuno | H01L 21/268 219/121.72 |
| 2010/0295177 | A1 * | 11/2010 | Ouchi | H01L 24/83 257/737 |
| 2011/0147066 | A1 * | 6/2011 | Sidhu | H05K 3/3489 174/261 |
| 2011/0221075 | A1 * | 9/2011 | Meura | H05K 3/305 257/779 |
| 2012/0098126 | A1 * | 4/2012 | Iwasaki | H01L 24/11 257/737 |
| 2013/0037957 | A1 * | 2/2013 | Takahashi | B23K 35/3612 257/772 |
| 2014/0231492 | A1 * | 8/2014 | Saeki | H05K 3/3436 228/180.22 |
| 2015/0258638 | A1 * | 9/2015 | Hu | B23K 35/362 228/223 |
| 2017/0287823 | A1 * | 10/2017 | Adachi | H01L 23/49811 |

FOREIGN PATENT DOCUMENTS

| | | |
|---|---|---|
| JP | 11-087556 | 3/1999 |
| JP | 2000277554 A * | 10/2000 |
| JP | 2004-219964 | 8/2004 |
| JP | 2005-129836 | 5/2005 |
| JP | 2006-156455 | 6/2006 |
| JP | 2008-118161 | 5/2008 |
| JP | 2009-038331 | 2/2009 |
| JP | 2009-039331 | 2/2009 |
| JP | 2011-521458 | 7/2011 |
| JP | 2012-089574 | 5/2012 |

* cited by examiner

METHOD OF MANUFACTURING MOUNTING SUBSTRATE AND METHOD OF MANUFACTURING ELECTRONIC APPARATUS

CROSS REFERENCES TO RELATED APPLICATIONS

The present application claims priority to Japanese Priority Patent Application JP 2013-104225 filed in the Japan Patent Office on May 16, 2013, the entire content of which is hereby incorporated by reference.

BACKGROUND

The present application relates to a method of manufacturing a mounting substrate that mounts a device on a substrate by the use of a transfer technique, and a method of manufacturing an electronic apparatus that includes such a mounting substrate.

One of technologies for mounting a lightweight and thin or fine device is a transfer technique. In a case where a device is transferred on a substrate utilizing such a transfer technique, when an electrical connection is made between the transferred device and wiring, it is necessary to form a wiring layer after the device is transferred. In this case, for example, the wiring layer may be formed in such a manner that a device is beforehand reduced in thickness to reduce unevenness of a surface that may be caused by a thickness of the device, or the wiring layer may be formed in such a manner that a vacant space between the devices is beforehand buried to flatten a surface on which the wiring layer is formed (see Japanese Unexamined Patent Application Publication Nos. H10-090688, 2004-219964, and 2006-156455).

SUMMARY

When the transfer technique is used, as described above, it is necessary to form a wiring layer after a device is transferred. As a result, this has posed an issue of involving a lot of processes after a transfer process is completed.

It is desirable to provide a method of manufacturing a mounting substrate and a method of manufacturing an electronic apparatus that allow processes in case of use of the transfer technique to be simplified.

According to an embodiment of the present application, there is provided a method of manufacturing a mounting substrate that includes following two procedures.

(A1) Transferring part or all of a plurality of devices on a device substrate onto a wiring substrate, and temporarily fixing the transferred devices to the wiring substrate with use of a fixing layer having viscosity, the device substrate including a support substrate and the plurality of devices fixed on the support substrate (A2) Performing a reflow process on the wiring substrate to electrically connect the transferred devices with the wiring substrate, and thereby forming the mounting substrate According to an embodiment of the present application, there is provided a method of manufacturing an electronic apparatus that is a method of manufacturing an electronic apparatus provided with a mounting substrate, and that includes following three procedures.

(B1) Transferring part or all of a plurality of devices on a device substrate onto a wiring substrate, and temporarily fixing the transferred devices to the wiring substrate with use of a fixing layer having viscosity, the device substrate including a support substrate and the plurality of devices fixed on the support substrate (B2) Performing a reflow process on the wiring substrate to electrically connect the transferred devices with the wiring substrate, and thereby forming the mounting substrate (B3) Electrically connecting the mounting substrate with a control section, and thereby forming an electronic apparatus In the method of manufacturing a mounting substrate and the method of manufacturing an electronic apparatus according to the above-described respective embodiments of the present application, an electrical connection between the transferred device and the wiring substrate is made by performing the reflow process on the wiring substrate in a state where the transferred device is temporarily fixed to the wiring substrate with the use of the fixing layer having viscosity. This makes it possible to omit a step of burying a vacant space between the devices to flatten a surface on which the wiring layer is formed, or a step of forming the wiring layer to make the electrical connection between the device and the wiring.

According to the method of manufacturing a mounting substrate and the method of manufacturing an electronic apparatus of the above-described respective embodiments of the present application, an electrical connection between the transferred device and the wiring substrate is made by performing the reflow process on the wiring substrate in a state where the transferred device is temporarily fixed to the wiring substrate with the use of the fixing layer having viscosity. Therefore, it is possible to simplify processes in case of using the transfer technique.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the present disclosure, and are incorporated in and constitute a part of this specification. The drawings illustrate embodiments and, together with the specification, serve to explain the principles of the present application.

DETAILED DESCRIPTION

Figure 1:
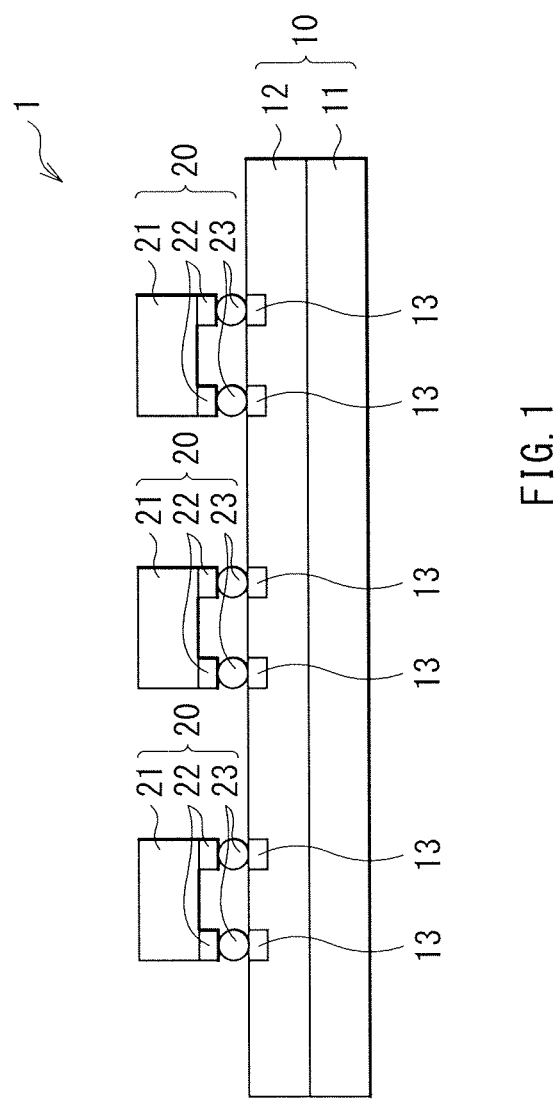
FIG. 1 is a cross-sectional view showing an example of a configuration of a mounting substrate according to a first embodiment of the present application.

Hereinafter, some embodiments of the present application are described in details with reference to the drawings. It is to be noted that the descriptions are provided in the order given below.

1. First Embodiment (Mounting Substrate)

An example where a device includes a bump, and a fixing layer is provided on a wiring substrate side 2. Modification Example of First Embodiment (Mounting Substrate)

An example where a device includes a bump, and a fixing layer is provided on a device substrate side A variation of an electrical connection part 3. Second Embodiment (Mounting Substrate)

An example where a wiring substrate includes a bump, and a fixing layer is provided on a device substrate side 4. Modification Example of Second Embodiment (Mounting Substrate)

An example where a wiring substrate includes a bump, and a fixing layer is provided on a wiring substrate side A variation of an electrical connection part 5. Third Embodiment (Mounting Substrate)

An example where a device and a support substrate include no bump, and a fixing layer is provided on a support substrate side 6. Fourth Embodiment (Electronic Apparatus)

1. First Embodiment

Configuration

Figure 2:
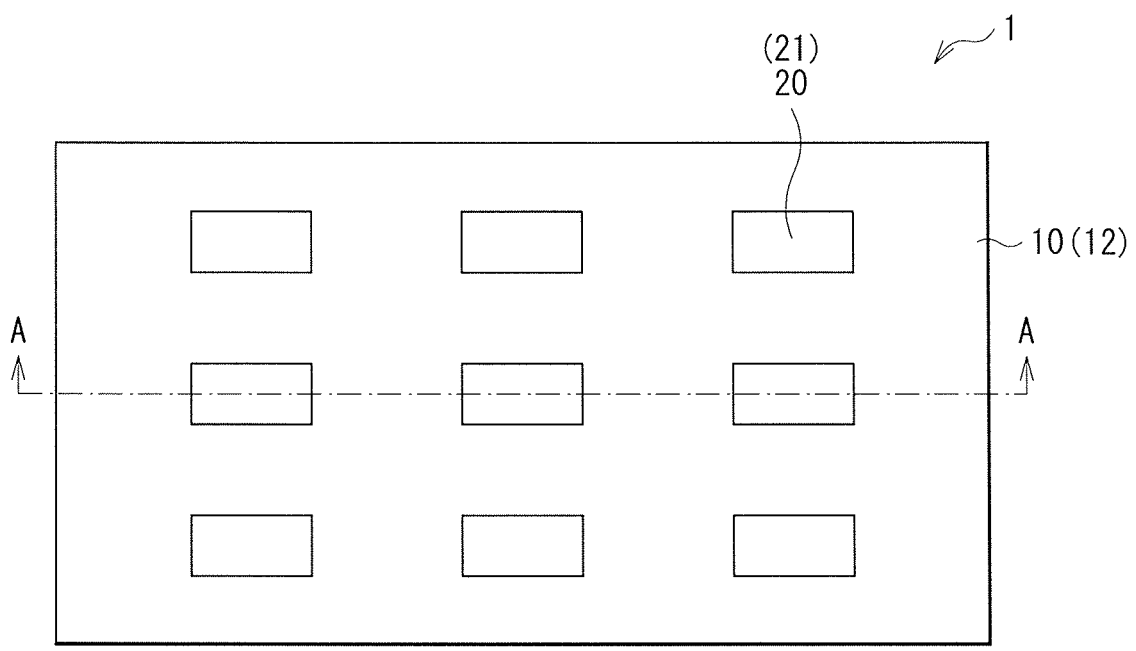
FIG. 2 is a top view showing an example of a configuration of the mounting substrate illustrated in FIG. 1.

First, description is provided on a mounting substrate 1 according to a first embodiment of the present application. FIG. 1 shows an example of a cross-sectional configuration of the mounting substrate 1. FIG. 2 shows an example of a top surface configuration of the mounting substrate 1. FIG. 1 corresponds to a cross-sectional configuration in the direction shown with an arrow A-A in FIG. 2. The mounting substrate 1 is a substrate where a plurality of devices 20 are mounted on a wiring substrate 10. The wiring substrate 10 and each of the devices 20 are electrically connected with each other.

The wiring substrate 10 may include, for example, a support substrate 11, an insulating layer 12, and a metallic layer 13. Also, the wiring substrate 10 may include, for example, a plurality of wires that are electrically connected with one or more metallic layers 13 in the insulating layer 12. The support substrate 11 supports the plurality of devices 20, and may be configured of, for example, a silicon substrate, a glass substrate, a resin substrate, and/or the like. The insulating layer 12 is a layer for insulating the plurality of above-described wires from one another, and serves as an interlayer insulating film. The insulating layer 12 may be configured of, for example, an insulating inorganic material such as $SiO_2$. The top surface of the insulating layer 12 has a role as a mounting surface on which each of the devices 20 is mounted. A wiring layer is formed of the insulating layer 12 and the plurality of above-described wires.

The metallic layer 13 electrically connects the device 20 with the above-described wires, and is electrically connected with the above-described wires in the insulating layer 12. The metallic layer 13 may be configured to include, for example, UBM (Under Bump Metal) that serves as a foundation for a solder bump. The UBM may be configured of a material such as Ni, and serves as a solder diffusion suppression layer. In the metallic layer 13, for example, the side surface thereof may be buried in the insulating layer 12, and the top surface thereof may be exposed. The metallic layer 13 is arranged in such a manner that, for example, the top surface of the metallic layer 13 may be in the same plane as the top surface of the insulating layer 12. It is to be noted that it is not necessary that all of the metallic layers 13 be electrically connected with the wires in the insulating layer 12. For example, some metallic layers 13 out of the plurality of metallic layers 13 that are provided in correspondence with the respective devices 20 may be those that are joined with metallic protrusions that are provided on the respective devices 20 to assure the stability of the devices 20.

As detailed hereinafter, each of the devices 20 on the wiring substrate 10 is transferred on the wiring substrate 10 from a device substrate 30 using a transfer technique. The respective devices 20 are arranged to be away from one another in a plane. The device 20 may be, for example, a submillimeter-sized chip. It is to be noted that the device 20 may be larger in size than a submillimeter size. The device 20 is an individual component in a chip-shaped form to be used as a constituent part for an apparatus or an electronic circuit. Examples of the device 20 may include a light-emitting device (such as an LED (Light-Emitting Diode), an LD (Laser Diode), an organic EL), a light receiving device (such as a photodiode, a photodetector, a CCD (Charge-Coupled Device), and a CMOS (Complementary Metal-Oxide Semiconductor)), and a circuit device (such as a capacitor, a transistor, a resistor, an IC (Integrated Circuit), and an LSI (Large-Scale Integrated Circuit)). Alternatively, the device 20 may be a device that includes at least two out of the above-described light-emitting devices, light receiving devices, and circuit devices, for example.

For example, as shown in FIG. 1, the device 20 may have a function section 21, and a metallic layer 22 and a solder bump 23 that are provided on the undersurface of the function section 21. The function section 21 is a part having the functions of the device 20 that is exemplified in the above, and may be configured to include, for example, an LED, an LD, an organic EL, a photodiode, a photodetector, a CCD, a CMOS, a capacitor, a transistor, a resistor, an IC, an LSI, and/or the like. The metallic layer 22 makes a connection between the function section 21 and the metallic layer 13 via the solder bumps 23, and is electrically or capacitively connected with the function section 21. It is to be noted that, when each of the devices 20 is provided with the plurality of metallic layers 22, a part of these metallic layers 22 may be a dummy that is not useful for the functions of the function section 21. In this case, a portion that is configured of the dummy metallic layer 13 and the solder bump 23 that is provided on such a dummy metallic layer 13 serves as a metallic protrusion that is provided on the device 20 to assure the stability of the device 20.

The metallic layer 22 and the solder bump 23 are laminated in this order on the undersurface of the function section 21. The metallic layer 22 and the solder bump 23 are projecting toward the wiring substrate 10 side on the undersurface of the function section 21, and configure a protrusion standing out from a surrounding area. In other words, each of the devices 20 has an electrically-conductive protrusion that is made up of the metallic layer 22 and the solder bump 23. For example, as shown in FIG. 1, the electrically-conductive protrusion may be configured of a block-like metal member. It is to be noted that the conductive protrusion may be alternatively configured of, for example, a wedge-like metal member. Further, it is to be noted that the solder bump 23 may not necessarily be in a spherical shape from the beginning. The solder bump 23 may take a shape such as cylinder, circular cone, inverted circular cone, mushroom form, quadrangular pyramid, quadrangular prism, prismatic column, pyramid, polygonal pyramid, and polygonal column. The solder bump 23 is transformed into an almost spherical shape by surface tension of a solder in a state of being in the form of a liquid with a temperature above the solder melting point.

It is to be noted that FIG. 1 illustrates by an example a case where each of the devices 20 has two electrically-conductive protrusions on the undersurface of the function section 21. However, each of the devices 20 may have one or three or more electrically-conductive protrusions alternatively. The electrically-conductive protrusion may be, for example, in a shape of a rectangle, square, circle, or ellipse when viewed from a direction of a normal to the undersurface of the function section 21. The number of the electrically-conductive protrusions may be desirably three or more in consideration of the stability of the device 20. When the number of the electrically-conductive protrusions is one or two, the electrically-conductive protrusion may be desirably in a shape of a rectangle or ellipse in consideration of the stability of the device 20.

The metallic layer 22 may be configured to include the UBM, for example. In the metallic layer 22, for example, a part of the side surfaces thereof may be exposed from the function section 21, and the undersurface thereof may be exposed. The solder bump 23 may be configured of, for example, alloy containing lead or tin as a primary component, and may be formed in a manner of, for example, electrolytic plating, imprinting of a solder paste, and/or the like.

[Manufacturing Method]

Next, the description is provided on an example of a method of manufacturing the mounting substrate 1.

Figure 3:
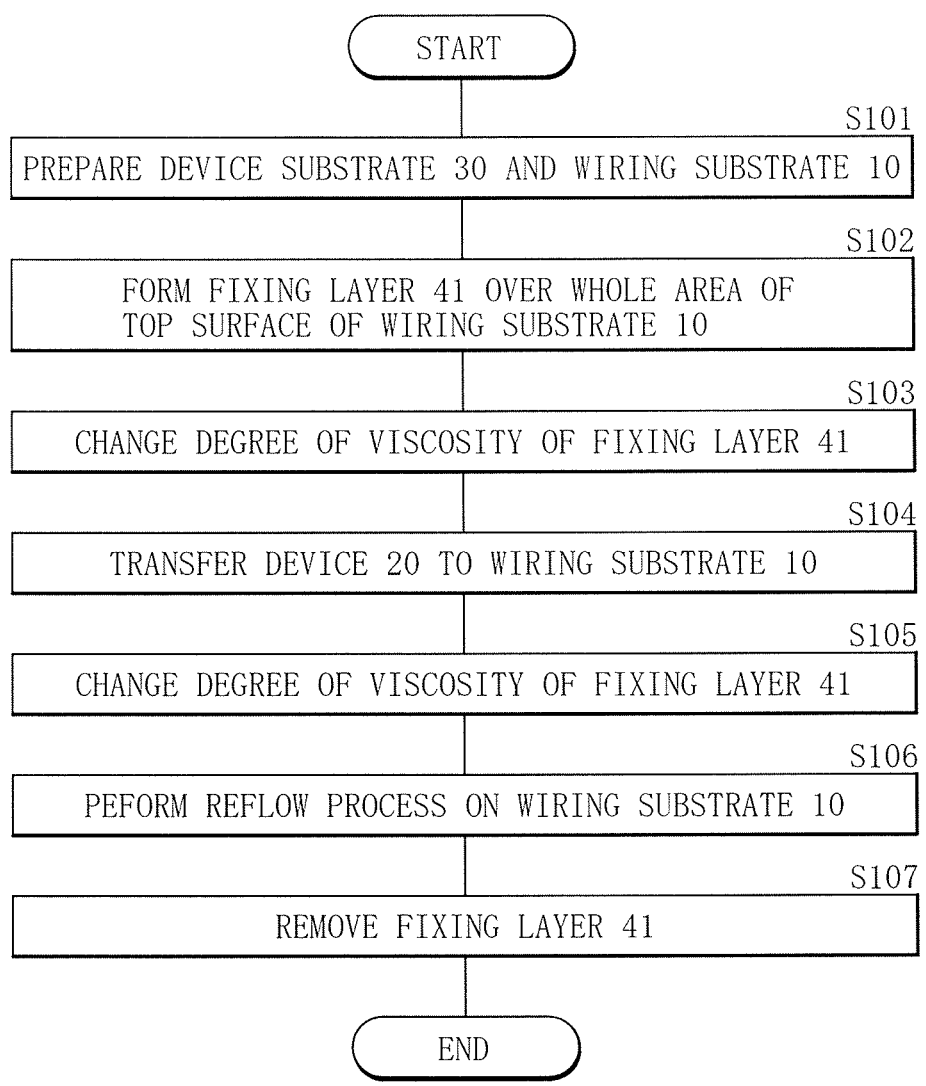
FIG. 3 is a flowchart showing an example of a manufacturing process of the mounting substrate illustrated in FIG. 1.

FIG. 3 shows an example of a manufacturing process for the mounting substrate 1 using a flowchart. Each of FIG. 4 to FIG. 10 shows an example of a manufacturing process for the mounting substrate 1 using a cross-sectional view. First, the device substrate 30 and the wiring substrate 10 are prepared (step S101, FIG. 4 and FIG. 5).

Figure 4:
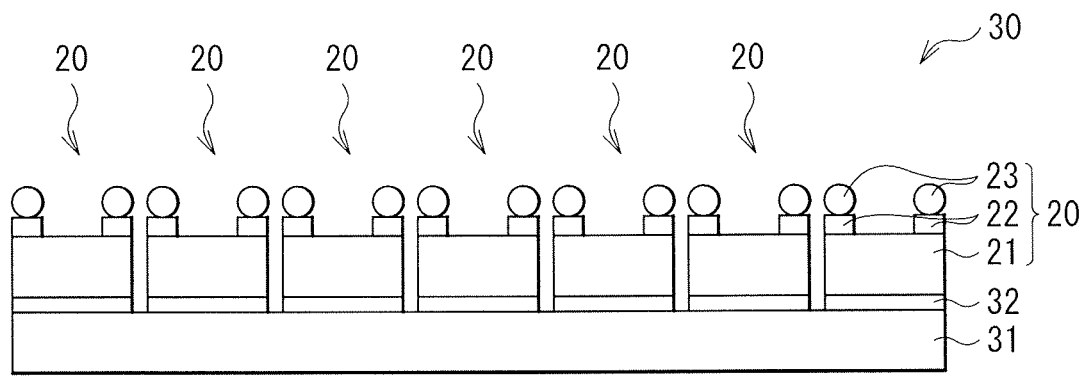
FIG. 4 is a cross-sectional view showing an example of a configuration of a device substrate.

For example, as shown in FIG. 4, the device substrate 30 may have a support substrate 31, a fixing layer 32, and the plurality of devices 20. Each of the devices 20 is arranged on the support substrate 31 with the metallic layer 22 directed upward (that is, with the metallic layer 22 directed toward the opposite side, of the function section 21, from the support substrate 31). The support substrate 31 supports the plurality of devices 20, and may be configured of, for example, a silicon substrate, a glass substrate, a resin substrate, and/or the like. The fixing layer 32 fixes each of the devices 20 on the support substrate 31, and peels off each of the devices 20 from the support substrate 31 at the time of a transfer process. When a transfer is carried out by a laser ablation method, the fixing layer 32 may be configured of, for example, a material that absorbs light at laser oscillation wavelength band. The fixing layer 32 may be formed, for example, over a whole area of the top surface of the support substrate 31. For example, as shown in FIG. 4, the fixing layer 32 may be formed only at a gap between the support substrate 31 and each of the devices 20. Considering the transfer performance, as shown in FIG. 4, the fixing layer 32 may be preferably formed for each of the devices 20. Further, considering the simplicity of the process, the fixing layer 32 may be preferably formed over a whole area of the top surface of the support substrate 31. The fixing layer 32 may come in direct contact with the support substrate 31. It is to be noted that an adhesion layer, an insulating layer, a metallic layer, and/or the like may be interposed between the fixing layer 32 and the support substrate 31.

Figure 6:
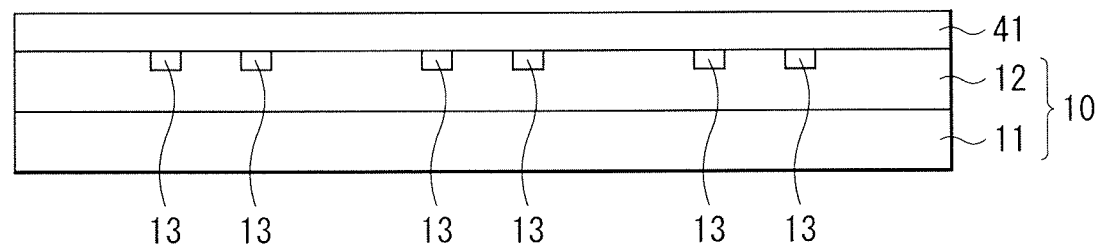
FIG. 6 is a cross-sectional view showing a process following on the process shown in FIG. 5.

Next, a fixing layer 41 is formed over a whole area of the top surface of the wiring substrate 10 (step S102, FIG. 6). The fixing layer 41 accepts each of the devices 20 at the time of a transfer process, and holds one or more of the transferred devices 20 using an adhesive force. The fixing layer 41 is in the form of a liquid having viscosity or a gel, and may be configured of, for example, a flux. The flux is mainly made of resin and solvent. The flux is a so-called solder flux, and is a material in the form of a liquid or a paste that has a function of reducing oxides on the metal surface or includes an activator to have a reduction action. The above-described activator may be molten salt, acid, or the like having the reducing characteristics. The above-described molten salt may be a halide, such as chloride and fluoride. Examples of the above-described acid may include ortho-phosphoric acid, organic acid, amines, hydrohalic acid amine salt, and the like. In some instances, any other additive agent may be added to the flux as appropriate.

By the use of a method such as spin coating, spray method, doctor blade method, printing, transfer method, and imprinting method, the flux is coated with a small and uniform thickness over a whole area of the top surface of the wiring substrate 10. Therefore, at this time, the flux has a low degree of viscosity suitable for coating.

Subsequently, the degree of the viscosity of the fixing layer 41 on the wiring substrate 10 is changed (step S103). For example, using at least one method of heating, decompression, light irradiation, and addition of curing agent, a process is carried out that raises the degree of the viscosity of the flux applied on the top surface of the wiring substrate 10. The degree of the viscosity of the fixing layer 41 is changed after the fixing layer 41 is formed on the top surface of the wiring substrate 10 and before a transfer process to be hereinafter described is performed. One reason for this is that the optimum degree of viscosity desired for the fixing layer 41 when the fixing layer 41 is applied on the top surface of the wiring substrate 10 is different from that when the fixing layer 41 accepts each of the devices 20 at the time of the transfer process. More specifically, when the fixing layer 41 is formed on the top surface of the wiring substrate 10, the degree of the viscosity of the fixing layer 41 may be preferably relatively low, and may be preferably relatively high at the time of the transfer process.

When heating is used for changing the degree of viscosity, a solvent contained in the flux is volatized by heating the wiring substrate 10 using, for example, a hot plate, an atmosphere furnace, an infrared heating furnace, and/or the like to change the viscosity of the flux. When a decompression furnace is used for changing the viscosity, the wiring substrate 10 coated with the flux is placed in the decompression furnace to be in a decompression state slowly. This volatizes the solvent contained in the flux to change the degree of the viscosity of the flux. In a case where the light irradiation is used for changing the degree of the viscosity, and when photosensitive resin is used as resin to be contained in the flux, the photosensitive resin is modified in composition in such a manner that the flux is irradiated with optical energy rays such as ultraviolet rays, to change the degree of the viscosity of the flux. When a curing agent is used for changing the degree of the viscosity, the curing agent having a curing function is sprayed onto the flux applied on the top surface of the wiring substrate 10 to change the degree of the viscosity of the flux.

Figure 8:
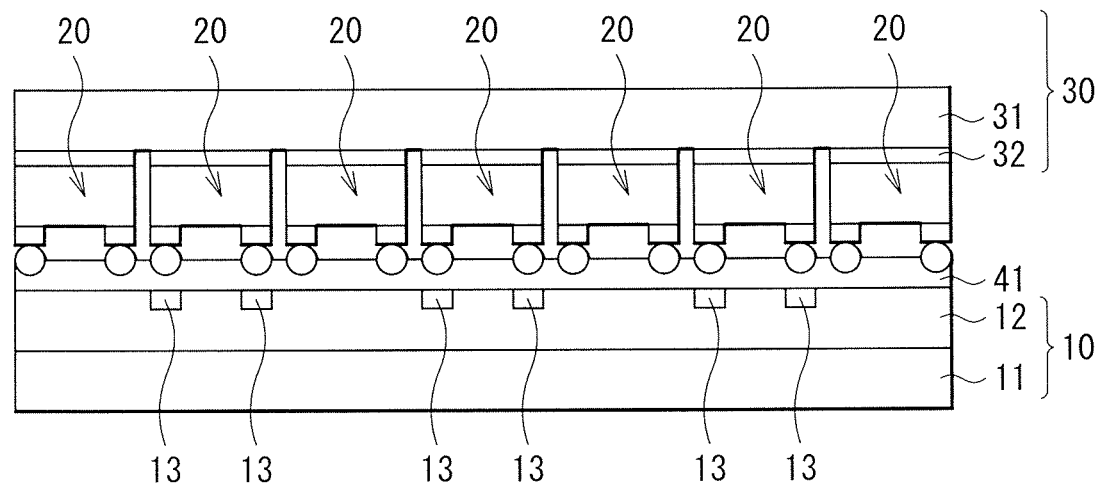
FIG. 8 is a cross-sectional view showing a process following on the process shown in FIG. 7.
Figure 9:
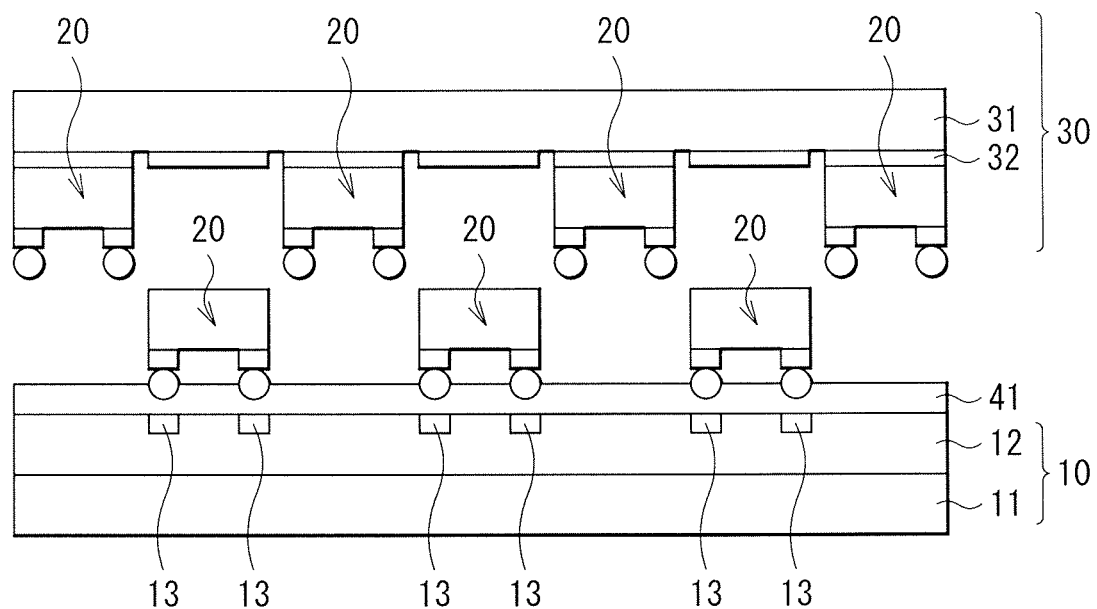
FIG. 9 is a cross-sectional view showing a process following on the process shown in FIG. 8.

Thereafter, part or all of the plurality of devices 20 on the device substrate 30 are transferred on the wiring substrate 10 (step S104). First, the device substrate 30 and the wiring substrate 10 are attached to a transfer apparatus. Next, the device substrate 30 and the wiring substrate 10 are arranged in opposition to each other with a predetermined vacant space 42 interposed between (that is, with them placed away from each other) (FIG. 7) or with them closely-attached to each other (FIG. 8). Subsequently, one or more of the plurality of devices 20 on the device substrate 30 are transferred on the wiring substrate 10 using, for example, a laser ablation method (FIG. 9). This temporarily fixes the transferred device(s) 20 (or solder bumps 23) on the wiring substrate 10 with the use of the fixing layer 41. It is to be noted that such a transfer process may be carried out in a method other than the laser ablation.

At the time of the transfer process, an electrically-conductive protrusion that is configured of the metallic layer 22 and the solder bump 23 sticks into the fixing layer 41 to serve as an anchor. At this time, a height of the electrically-conductive protrusion that is configured of the metallic layer 22 and the solder bump 23 (to be exact, a distance between the undersurface of the function section 21 and a tip end of the solder bump 23) may be larger (longer) or smaller (shorter) than a thickness of the fixing layer 41.

After the transfer process, the whole metallic layer 22 or a part thereof and the metallic layer 13 are opposed to each other with the solder bump 23 in between. Further, when viewed from a direction of a normal to the mounting surface of the wiring substrate 10, it is enough that a portion where the metallic layer 22 and the metallic layer 13 are opposed to each other has an area at least about a half as large as the area of the metallic layer 22. Therefore, it is enough that this transfer process has the accuracy that allows such a transfer to be achieved.

Afterward, the degree of the viscosity of the fixing layer 41 on the wiring substrate 10 is changed (step S105). For example, by heating (post-baking), a process is carried out that raises the degree of the viscosity of the flux applied on the top surface of the wiring substrate 10. The degree of the viscosity of the fixing layer 41 is changed after the transfer is completed and before a reflow process to be hereinafter described is performed. One reason for this is that the optimum degree of viscosity desired for the fixing layer 41 when the fixing layer 41 accepts each of the devices 20 at the time of the transfer process is slightly different from that when the reflow process is performed. More specifically, when the reflow process is carried out, the degree of the viscosity of the fixing layer 41 may be desirably higher than that at the time of the transfer process. A specific method of changing the degree of viscosity is similar to the above-described method. It is to be noted that this step is intended to prevent each of the transferred devices 20 from shifting during a period of time before the reflow process is performed or during the reflow process. Therefore, this step may be omitted when there is not concern about such a possibility.

Subsequently, a reflow process is carried out for the wiring substrate 10 (step S106, FIG. 10). At this time, the solder bump 23 is melted or softened, and thus the metallic layer 22 and the metallic layer 13 are opposed to each other or are exactly face to face with each other due to a self-alignment function of the solder bump 23. Further, an electrical connection between the transferred device 20 (or the metallic layer 22) and the wiring substrate 10 (or the metallic layer 13) is made as a consequence of melting or softening of the solder bump 23. In other words, the transferred device 20 (or the metallic layer 22) and the wiring substrate 10 (or the metallic layer 13) are electrically connected with each other via the electrically-conductive protrusion (the solder bump 23). After the reflow process, the solder bump 23 is solidified, and accordingly, each of the devices 20 is fixed with high accuracy at a predetermined position on the support substrate 11.

Finally, the fixing layer 41 is removed (cleaned) (step S107). Here, it is sufficient that the flux used as the fixing layer 41 is dissolved, and any residual material is eliminated. A cleaning agent suitable for the flux may be used. At this time, it is possible to clear away any material (dirt) attached on the mounting surface of the wiring substrate 10, such as a residue that may be generated from the laser ablation, in conjunction with the cleaning of the flux. It is to be noted that when the flux is a non-cleaning type, removal of the fixing layer 41 may be omitted.

[Effects]

Next, description is provided on the effects of the method of manufacturing the mounting substrate 1.

In this embodiment of the present application, the electrical connection between the transferred device 20 and the wiring substrate 10 is made by performing a reflow process on the wiring substrate 10 in a state where the transferred device 20 is temporarily fixed to the wiring substrate 10 with the use of the fixing layer 41. This makes it possible to omit a step of burying a vacant space between the devices 20 to flatten a surface on which the wiring layer is formed, or a step of forming the wiring layer, in order to make the electrical connection between the device 20 and the wiring. As a result, this allows steps following on the transfer process to be simplified.

Figure 7:
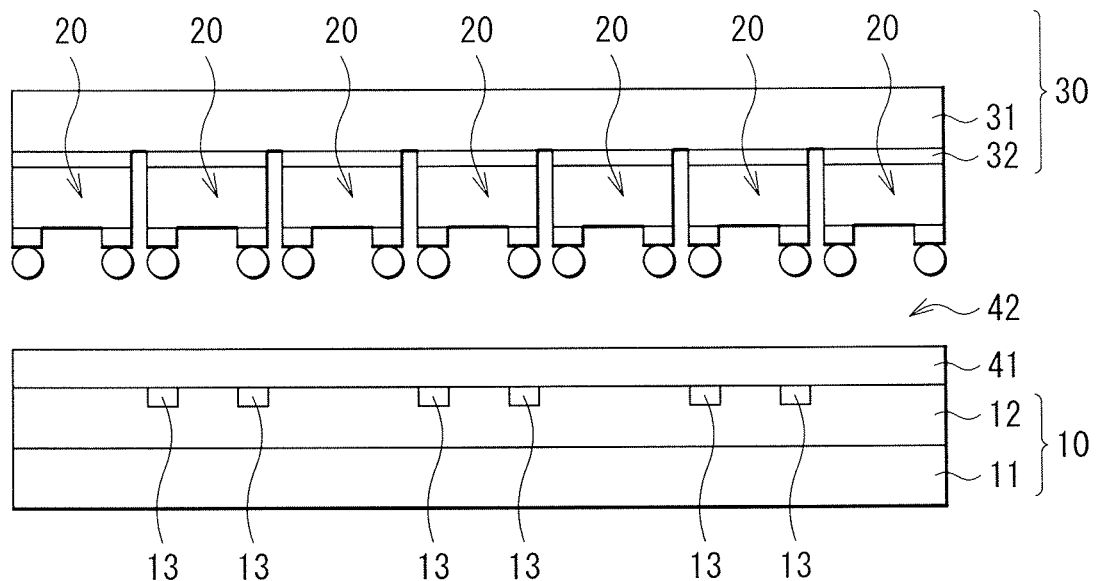
FIG. 7 is a cross-sectional view showing a process following on the process shown in FIG. 6.

Further, as shown in FIG. 7, when a non-contact transfer (proximity transfer) is carried out, each of the devices 20 remaining on the device substrate 30 without being transferred (hereinafter referred to as a "non-transferred device") does not come in contact with the fixing layer 41. Therefore, a part of the fixing layer 41 or a residue that may be generated from the laser ablation is not attached to the non-transferred device. Consequently, there is no concern about the possibility of deterioration in the transfer performance of the non-transferred device. In addition, in the proximity transfer, there is no necessity for moving the device substrate 30 up and down before or after the transfer process, which allows the transfer processing time to be shortened. Moreover, in the proximity transfer, the device substrate 30 and the wiring substrate 10 do not come in contact with each other. As a result, when there is slight unevenness on the surface (mounting surface) of the wiring substrate 10, or there is slight waviness on the device substrate 30 and/or the wiring substrate 10, it is possible to avoid damage to each of the devices 20 that could be caused by contact transfer.

Figure 10:
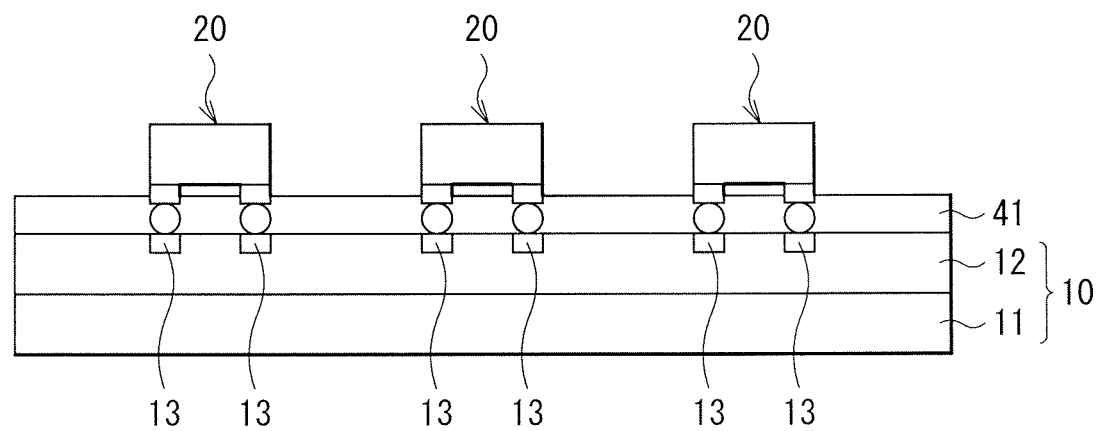
FIG. 10 is a cross-sectional view showing a process following on the process shown in FIG. 9.

In addition, as shown in FIG. 10, when the reflow process is carried out, it is possible to improve the alignment accuracy due to the self-alignment function of a solder. Therefore, there is no necessity for preparing a high-level adjusting apparatus for improving the alignment accuracy during the transfer process. As a result, it is possible to simplify steps during the transfer process, as well as to perform the transfer using inexpensive manufacturing facility. Further, when the electrical connection between the device 20 and the wiring substrate 10 is made using the reflow process, even if a defect in the device 20 is found later, it is possible to take out the defective device 20 with ease. In an existing method in which the device 20 is embedded to form the wiring layer, it is difficult to take out the defective device 20 with ease.

Moreover, in this embodiment of the present application, the degree of the viscosity of the fixing layer 41 is changed after the fixing layer 41 is applied on the top surface of the wiring substrate 10 and before the transfer process is performed. This makes it possible to reduce the possibility that a positional shift will occur in each of the devices 20 after the transfer. Further, in this embodiment of the present application, the degree of the viscosity of the fixing layer 41 is changed after the transfer process is performed and before the reflow process is performed. Also, this makes it possible to reduce the possibility that a positional shift will occur in each of the devices 20 immediately before or in the middle of the reflow process.

2. Modification Examples of First Embodiment

Modification Example 1

Figure 11:
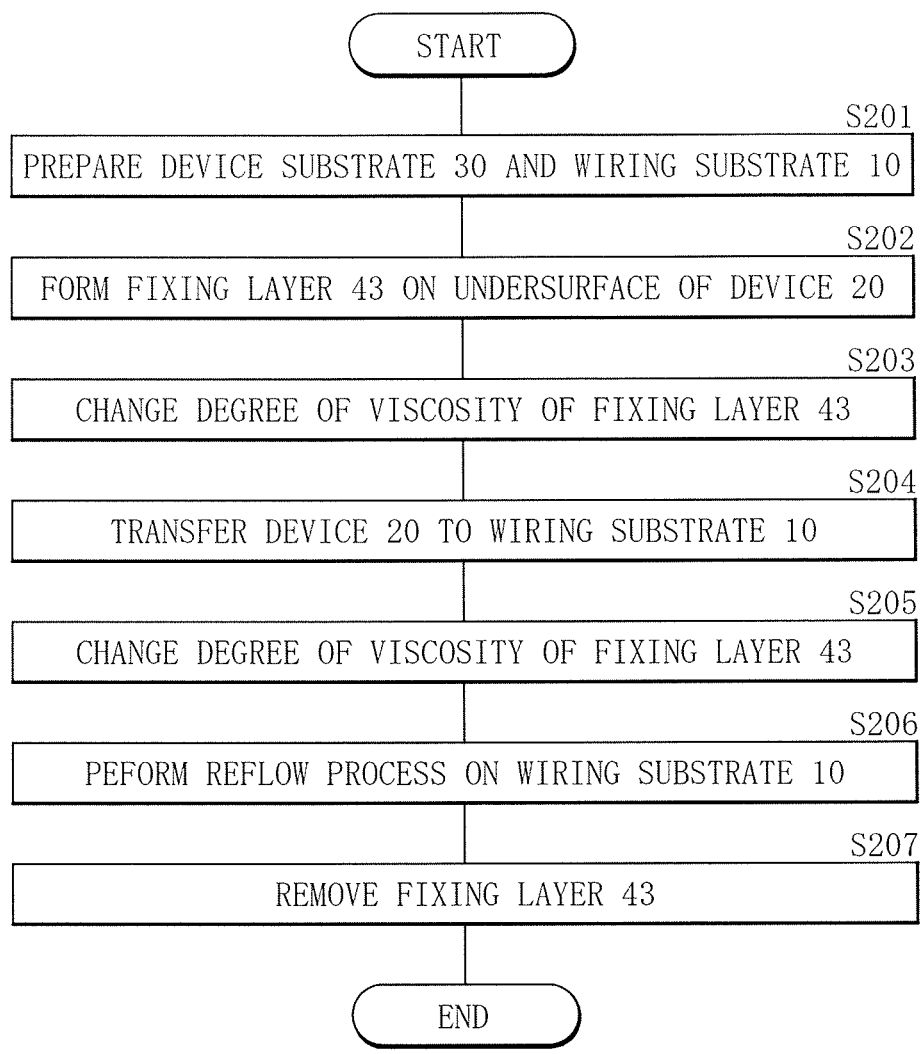
FIG. 11 is a flowchart showing another example of the manufacturing process of the mounting substrate illustrated in FIG. 1.
Figure 12:
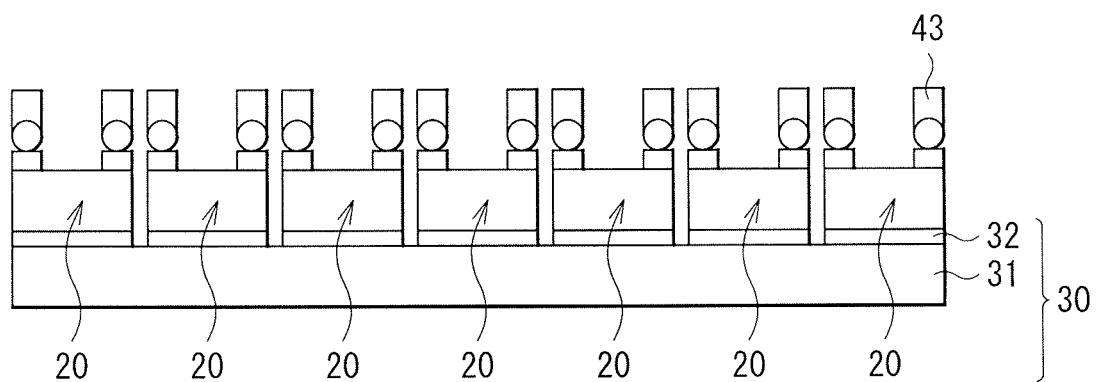
FIG. 12 is a cross-sectional view showing a process following on the process shown in FIG. 4.

Next, description is provided on a modification example of the method of manufacturing the mounting substrate 1 according to the above-described embodiment of the present application. FIG. 11 shows another example of the manufacturing process for the mounting substrate 1 using a flowchart. Each of FIG. 12 to FIG. 16 shows another example of the manufacturing process for the mounting substrate 1 using a cross-sectional view. In this modification example, a fixing layer 43 is used instead of the fixing layer 41. This fixing layer 43 is applied on the device substrate 30.

Figure 5:
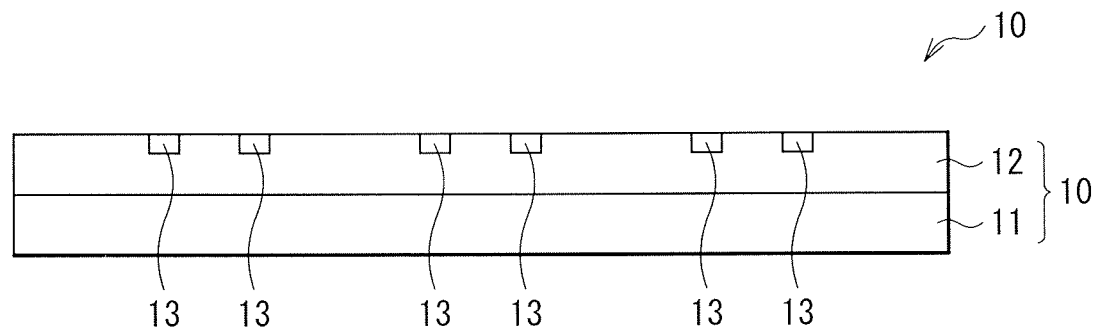
FIG. 5 is a cross-sectional view showing an example of a configuration of a wiring substrate.

First, the device substrate 30 and the wiring substrate 10 are prepared (step S201, FIG. 4 and FIG. 5). Next, the fixing layer 43 is formed on the undersurface of each of the devices 20 (step S202, FIG. 12). In concrete terms, the fixing layer 43 is formed on a top end of the electrically-conductive protrusion that is configured of the metallic layer 22 and the solder bump 23. It is to be noted that the fixing layer 43 may be formed only on the undersurface of the device 20 to be transferred among the plurality of devices 20 on the device substrate 30. The fixing layer 43 accepts each of the devices 20 at the time of the transfer process, while holding one or more of the transferred devices 20 using an adhesive force. More specifically, the fixing layer 43 is a flux. The flux is the same as the flux of the fixing layer 41 that is used in the above-described embodiment of the present application.

For example, by the use of a method such as a dip method, a spray method, and printing, the flux is applied with a small and uniform thickness on the top end of the electrically-conductive protrusion. Therefore, at this time, the flux has a low degree of viscosity suitable for coating.

Subsequently, the degree of the viscosity of the fixing layer 43 on the device substrate 30 is changed (step S203). For example, using at least one method of heating, decompression, light irradiation, and addition of curing agent, a process is carried out that raises the degree of the viscosity of the flux applied on the top surface of the device substrate 30. The degree of the viscosity of the fixing layer 43 is changed after the fixing layer 43 is formed on the device substrate 30 and before the transfer process to be hereinafter described is performed. One reason for this is that the optimum degree of viscosity desired for the fixing layer 43 when the fixing layer 43 is applied on the device substrate 30 is different from that when the fixing layer 43 accepts each of the devices 20 at the time of the transfer process. More specifically, when the fixing layer 43 is formed on the device substrate 30, the degree of the viscosity of the fixing layer 43 may be preferably relatively low, and may be preferably relatively high at the time of the transfer process. A specific method of changing the degree of viscosity is similar to the above-described method. It is to be noted that, in an embodiment where the optimum degree of viscosity desired for the fixing layer 43 when the fixing layer 43 is applied on the device substrate 30 is not significantly different from that when the fixing layer 43 accepts each of the devices 20 at the time of the transfer process, when the fixing layer 43 is applied on the device substrate 30, this step may be omitted.

Figure 14:
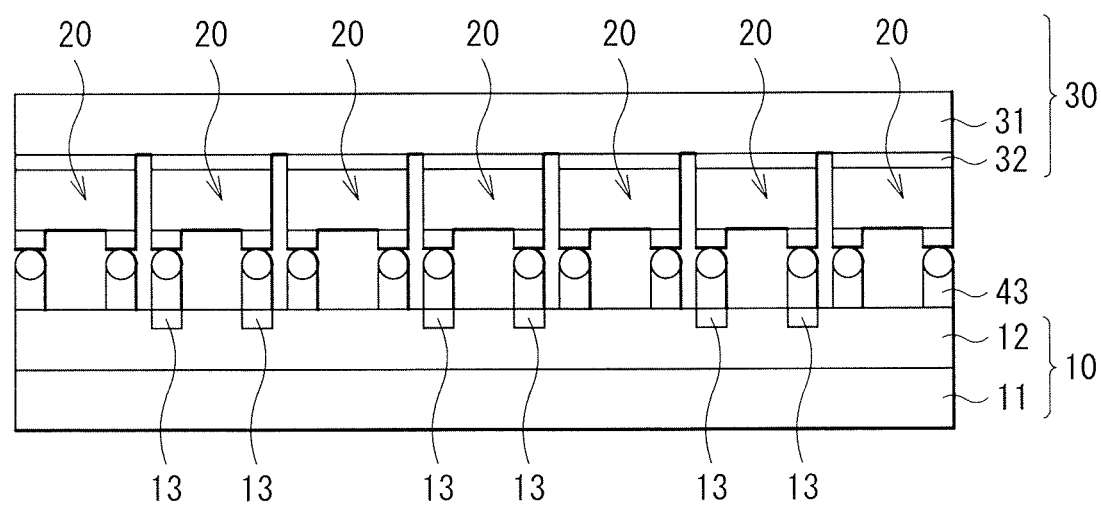
FIG. 14 is a cross-sectional view showing a process following on the process shown in FIG. 13.
Figure 15:
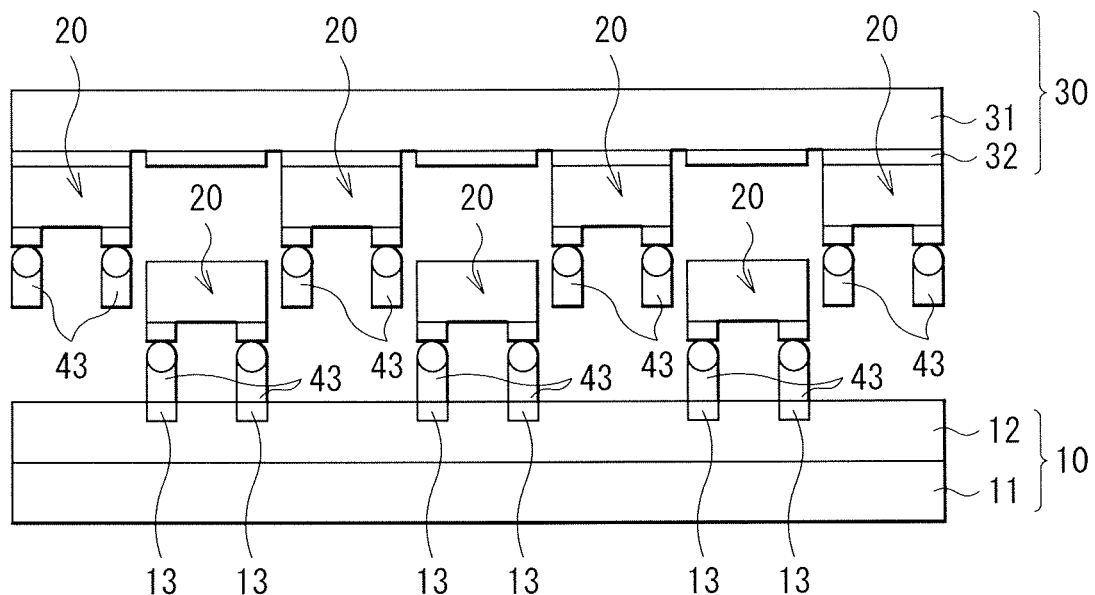
FIG. 15 is a cross-sectional view showing a process following on the process shown in FIG. 14.

Thereafter, part or all of the plurality of devices 20 on the device substrate 30 are transferred on the wiring substrate 10 (step S204). First, the device substrate 30 and the wiring substrate 10 are attached to a transfer apparatus. Next, the device substrate 30 and the wiring substrate 10 are arranged in opposition to each other with a predetermined vacant space 42 interposed between (that is, with them placed away from each other) (FIG. 13) or with them closely-attached to each other (FIG. 14). Subsequently, one or more of the plurality of devices 20 on the device substrate 30 are transferred on the wiring substrate 10 using, for example, a laser ablation method (FIG. 15). This temporarily fixes the transferred device(s) 20 (or the solder bump(s) 23) on the wiring substrate 10 with the use of the fixing layer 43. It is to be noted that such a transfer process may be carried out in a method other than the laser ablation.

At the time of the transfer process, an electrically-conductive protrusion that is configured of the metallic layer 22 and the solder bump 23 sticks into the fixing layer 43 to function as an anchor. At this time, it is important that a height of the electrically-conductive protrusion that is configured of the metallic layer 22 and the solder bump 23 (to be exact, a distance between the undersurface of the function section 21 and a tip end of the solder bump 23) is larger (longer) than a thickness of the fixing layer 43, in terms of an anchor effect.

After the transfer process, the whole metallic layer 22 or a part thereof and the metallic layer 13 are opposed to each other with the solder bump 23 in between. Further, when viewed from a direction of a normal to the mounting surface of the wiring substrate 10, it is enough that a portion where the metallic layer 22 and the metallic layer 13 are opposed to each other has an area at least about a half as large as the area of the metallic layer 22. Therefore, it is enough that this transfer process has the accuracy that allows such a transfer to be achieved.

Afterward, the degree of the viscosity of the fixing layer 43 on the wiring substrate 10 is changed (step S205). For example, by heating (post-baking), a process is carried out that raises the degree of the viscosity of the flux on the wiring substrate 10. The degree of the viscosity of the fixing layer 43 is changed after the transfer is completed and before the reflow process to be hereinafter described is performed. One reason for this is that the optimum degree of viscosity desired for the fixing layer 43 when the fixing layer 43 accepts each of the devices 20 at the time of the transfer process is slightly different from that when the reflow process is performed. More specifically, when the reflow process is carried out, the degree of the viscosity of the fixing layer 43 may be preferably higher than that at the time of the transfer process. A specific method of changing the degree of viscosity is similar to the above-described method. It is to be noted that this step is intended to prevent each of the transferred devices 20 from shifting during a period of time before the reflow process is performed or during the reflow process. Therefore, this step may be omitted when there is no such a possibility.

Subsequently, a reflow process is carried out for the wiring substrate 10 (step S206, FIG. 16). At this time, the solder bump 23 is melted or softened, and thus the metallic layer 22 and the metallic layer 13 are opposed to each other or are exactly face to face with each other due to a self-alignment function of the solder bump 23. Further, an electrical connection between the transferred device 20 (or the metallic layer 22) and the wiring substrate 10 (or the metallic layer 13) is made as a consequence of melting or softening of the solder bump 23. In other words, the transferred device 20 (or the metallic layer 22) and the wiring substrate 10 (or the metallic layer 13) are electrically connected with each other via the electrically-conductive protrusion (the solder bump 23). After the reflow process, the solder bump 23 is solidified, and accordingly, each of the devices 20 is fixed with high accuracy at a predetermined position on the support substrate 11.

Finally, the fixing layer 43 is removed (cleaned) (step S207). Here, it is sufficient that the flux used as the fixing layer 43 is dissolved, and any residual material is eliminated. A cleaning agent suitable for the flux may be used. At this time, it is possible to remove any material (dirt) attached on the mounting surface of the wiring substrate 10, such as a residue that may be generated from the laser ablation, in conjunction with the cleaning of the flux. It is to be noted that when the flux is a non-cleaning type, removal of the fixing layer 43 may be omitted.

Next, description is provided on the effects of the method of manufacturing the mounting substrate 1 in this modification example.

In this modification example, the electrical connection between the transferred device 20 and the wiring substrate 10 is made by performing a reflow on the wiring substrate 10 in a state where the transferred device 20 is temporarily fixed to the wiring substrate 10 with the use of the fixing layer 43. This makes it possible to omit a step of burying a vacant space between the devices 20 to flatten a surface on which the wiring layer is formed, or a step of forming the wiring layer, in order to make the electrical connection between the device 20 and the wiring. As a result, it is possible to simplify steps following on the transfer process.

Figure 13:
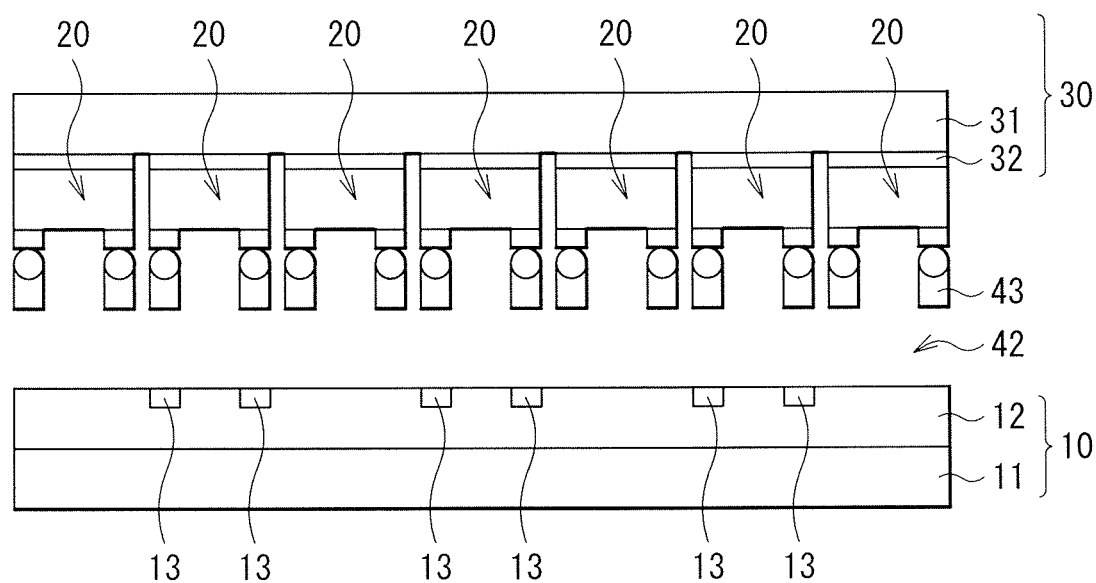
FIG. 13 is a cross-sectional view showing a process following on the process shown in FIG. 12.

Further, as shown in FIG. 13, when a non-contact transfer (proximity transfer) is carried out, the non-transferred device does not come in contact with the fixing layer 43. Therefore, a part of the fixing layer 43 or a residue that may be generated from the laser ablation is not attached to the non-transferred device. Consequently, there may be no possibility of deterioration in the transfer performance of the non-transferred device. In addition, in the proximity transfer, there is no necessity for moving the device substrate 30 up and down before or after the transfer process, which allows the transfer processing time to be shortened. Moreover, in the proximity transfer, the device substrate 30 and the wiring substrate 10 do not come in contact with each other. As a result, when there is slight unevenness on the surface (mounting surface) of the wiring substrate 10, or there is slight waviness on the device substrate 30, the wiring substrate 10 and/or the like, it is possible to avoid damage to each of the devices 20 that could be caused by a contact transfer.

Figure 16:
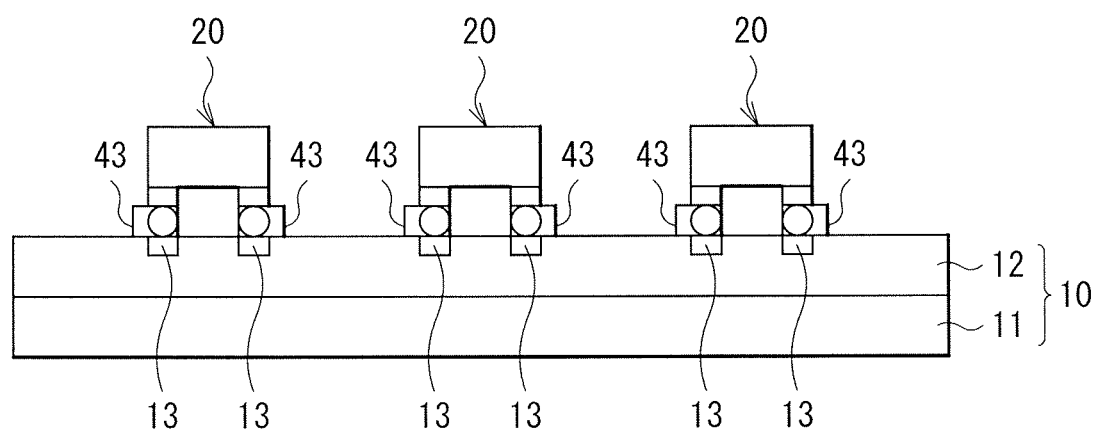
FIG. 16 is a cross-sectional view showing a process following on the process shown in FIG. 15.

In addition, as shown in FIG. 16, when the reflow is carried out, it is possible to improve the alignment accuracy due to the self-alignment function of a solder. Therefore, there may be no necessity for preparing a high-level adjusting apparatus for improving the alignment accuracy during the transfer process. As a result, it is possible to simplify steps during the transfer process, as well as to perform the transfer using inexpensive manufacturing facility. Further, when the electrical connection between the device 20 and the wiring substrate 10 is made using the reflow process, even if a defect in the device 20 is found later, it is possible to take out the defective device 20 with ease. In an existing method in which the device 20 is embedded to form the wiring layer, it is difficult to take out the defective device 20 with ease.

Modification Example 2

Figure 17A:
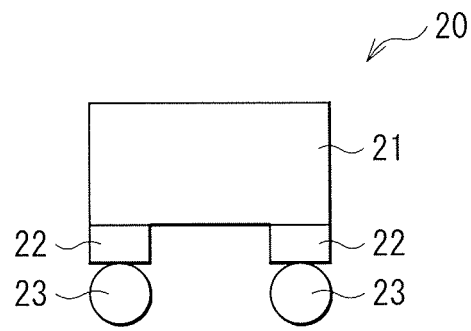
FIG. 17A is a cross-sectional view showing a modification example of the device illustrated in FIG. 1.
Figure 17B:
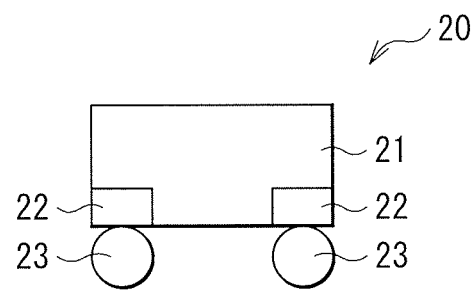
FIG. 17B is a cross-sectional view showing a modification example of the device illustrated in FIG. 1.
Figure 17C:
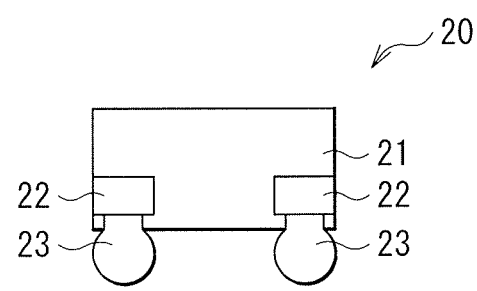
FIG. 17C is a cross-sectional view showing a modification example of the device illustrated in FIG. 1.

Next, description is provided on another modification example of the mounting substrate 1 according to the above-described embodiment and modification example thereof. In the above-described embodiment and modification example thereof, as shown in an example in FIG. 17A, the metallic layer 22 is provided on the undersurface of the function section 21, and the whole side surfaces or a part thereof of the metallic layer 22 and the undersurface of the metallic layer 22 are exposed to the outside without being covered by the function section 21. However, for example, as shown in FIG. 17B, the metallic layer 22 may be arranged in such a manner that the undersurface of the metallic layer 22 is in the same or almost the same plane as the undersurface of the function section 21. Alternatively, for example, as shown in FIG. 17C, the metallic layer 22 may be arranged in such a manner that the undersurface of the metallic layer 22 is located at a position recessed from the undersurface of the function section 21. It is to be noted that, in FIG. 17C, a depression is formed on the undersurface of the function section 21 in correspondence with the metallic layer 22, and the undersurface of the metallic layer 22 is exposed at the bottom of the depression.

Figure 18A:
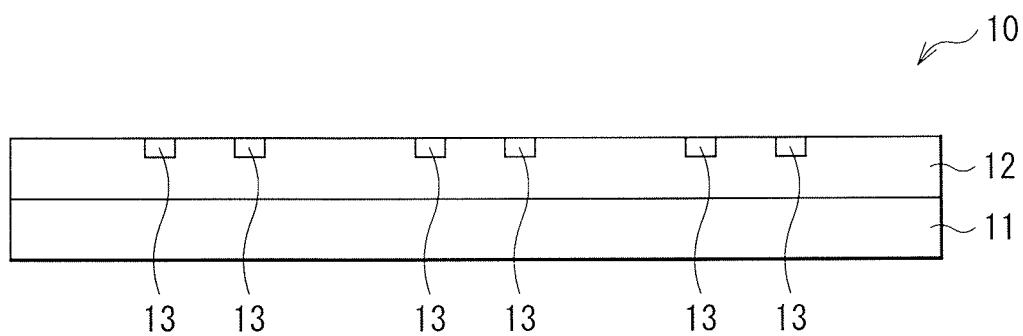
FIG. 18A is a cross-sectional view showing a modification example of the wiring substrate illustrated in FIG. 1.
Figure 18B:
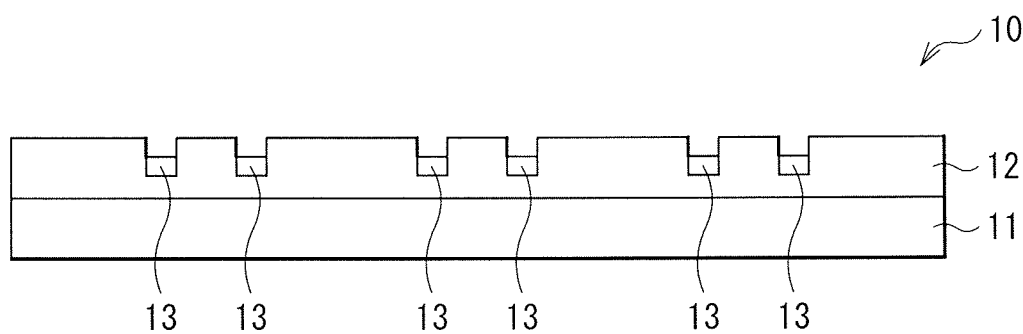
FIG. 18B is a cross-sectional view showing a modification example of the wiring substrate illustrated in FIG. 1.
Figure 18C:
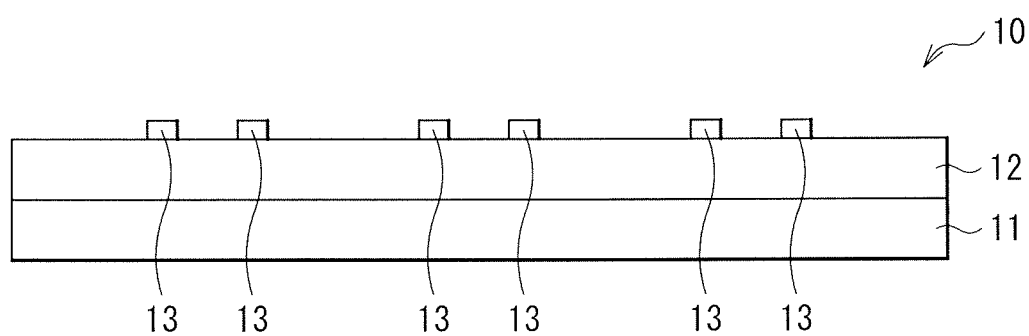
FIG. 18C is a cross-sectional view showing a modification example of the wiring substrate illustrated in FIG. 1.

Further, in the above-described embodiment and modification example thereof, as shown in an example in FIG. 18A, the metallic layer 13 is arranged in such a manner that the top surface of the metallic layer 13 is in the same or almost the same plane as the mounting surface of the wiring substrate 10 (the top surface of the insulating layer 12). However, for example, as shown in FIG. 18B, the metallic layer 13 may be arranged in such a manner that the top surface of the metallic layer 13 is located at a position recessed from the mounting surface of the wiring substrate 10 (the top surface of the insulating layer 12). It is to be noted that, in FIG. 18B, a depression is formed on the mounting surface of the wiring substrate 10 (the top surface of the insulating layer 12) in correspondence with the metallic layer 13, and the top surface of the metallic layer 13 is exposed at the bottom of the depression. Alternatively, for example, as shown in FIG. 18C, the metallic layer 13 may be provided on the mounting surface of the wiring substrate 10 (the top surface of the insulating layer 12), and the whole side surfaces or a part thereof of the metallic layer 13 and the top surface of the metallic layer 13 may be exposed to the outside without being covered by the insulating layer 12. At this time, the metallic layer 13 becomes an electrically-conductive protrusion standing out from a surrounding area on the mounting surface of the wiring substrate 10 (the top surface of the insulating layer 12).

Moreover, in this modification example, the viscosity of the fixing layer 43 is changed after the fixing layer 43 is applied on the top surface of the device substrate 30 and before the transfer process is performed. This makes it possible to reduce the possibility that a positional shift will occur in each of the devices 20 after the transfer. Further, in this embodiment of the present application, the degree of the viscosity of the fixing layer 43 is changed after the transfer process is performed and before the reflow process is performed. Also, this makes it possible to reduce the possibility that a positional shift will occur in each of the devices 20 immediately before or in the middle of the reflow process.

3. Second Embodiment

Configuration

Figure 19:
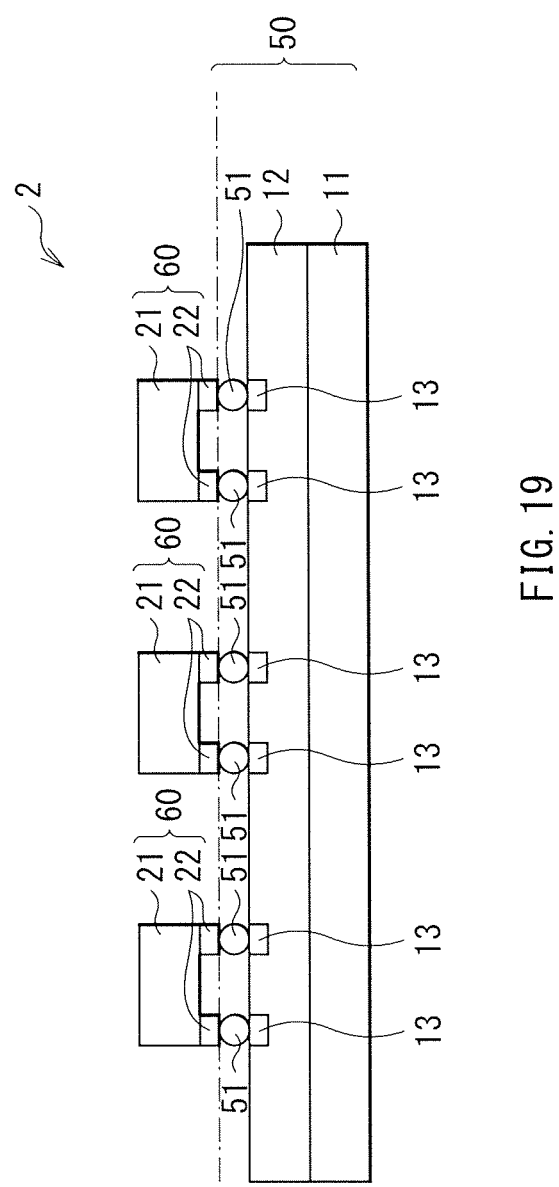
FIG. 19 is a cross-sectional view showing an example of a configuration of a mounting substrate according to a second embodiment of the present application.
Figure 20:
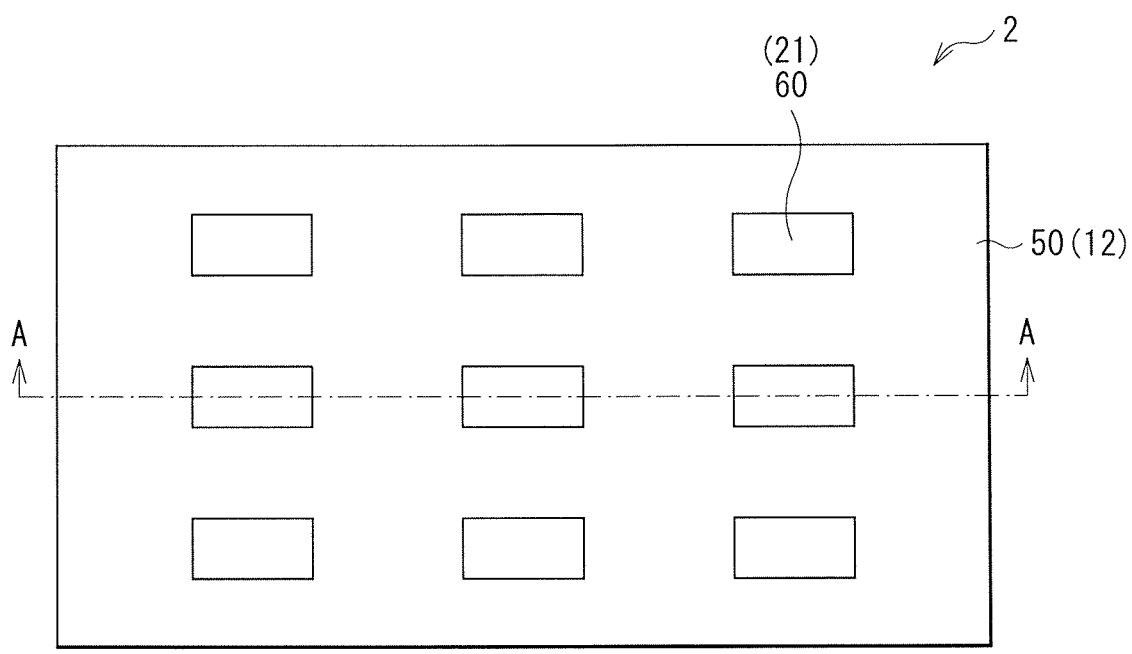
FIG. 20 is a top view showing an example of a configuration of the mounting substrate illustrated in FIG. 19.

Next, description is provided on a mounting substrate 2 according to a second embodiment of the present application. FIG. 19 shows an example of a cross-sectional configuration of the mounting substrate 2. FIG. 20 shows an example of a top surface configuration of the mounting substrate 2. FIG. 19 corresponds to a cross-sectional configuration in the direction shown with an arrow A-A in FIG. 20. The mounting substrate 2 is a substrate where a plurality of devices 60 are mounted on a wiring substrate 50. The wiring substrate 50 and each of the devices 60 are electrically connected with each other.

The wiring substrate 50 may include, for example, a support substrate 11, an insulating layer 12, a metallic layer 13, and a solder bump 51. The wiring substrate 50 is equivalent to a substrate in which the solder bump 51 is provided on the wiring substrate 10 in the above-described first embodiment of the present application. The solder bump 51 may be configured of, for example, alloy containing lead or tin as a primary component, and may be formed in a manner of, for example, electrolytic plating, imprinting of a solder paste, and/or the like. It is to be noted that it is not necessary that the solder bump 51 be in a spherical shape from the beginning. The solder bump 51 may take a shape, such as cylinder, circular cone, inverted circular cone, mushroom form, quadrangular pyramid, quadrangular prism, prismatic column, pyramid, polygonal pyramid, and polygonal column. The solder bump 51 is transformed into an almost spherical shape by surface tension of a solder in a state of being in the form of a liquid with a temperature above the solder melting point. The solder bump 51 is projecting toward the device 60 side on the mounting surface of the wiring substrate 50 (the top surface of the insulating layer 12), and configures a protrusion standing out from a surrounding area. For example, as shown in FIG. 19, such an electrically-conductive protrusion may be configured of a block-like (or spherical) metal member. It is to be noted that the electrically-conductive protrusion may be alternatively configured of, for example, a wedge-like metal member.

It is to be noted that FIG. 19 illustrates by an example a case where the wiring substrate 50 has two electrically-conductive protrusions in correspondence with each of the devices 60. However, the wiring substrate 50 may have one or three or more electrically-conductive protrusions alternatively. The electrically-conductive protrusion may be, for example, in a shape of a rectangle, square, circle, or ellipse when viewed from a direction of a normal to the mounting surface of the wiring substrate 50 (the top surface of the insulating layer 12). The number of the electrically-conductive protrusion may be preferably three or more in consideration of the stability of the device 60. When the number of the electrically-conductive protrusion is one or two, the electrically-conductive protrusion may be preferably in a shape of a rectangle or ellipse in consideration of the stability of the device 60.

As detailed hereinafter, each of the devices 60 on the wiring substrate 50 is transferred on the wiring substrate 50 from a device substrate 70 using a transfer technique. The respective devices 60 are arranged to be away from one another in a plane. The device 60 may be, for example, a submillimeter-sized chip. It is to be noted that the device 60 may be larger in size than a submillimeter size. The device 60 is an individual component to be used as a constituent part for an apparatus or an electronic circuit in a chip-shaped form. Examples of the device 60 may include a light-emitting device (such as an LED, an LD, and an organic EL), a light receiving device (such as a PD), and a circuit device (such as a capacitor, a transistor, a resistor, an IC, and an LSI). Alternatively, the device 60 may be a device that includes at least two out of the above-described light-emitting devices, light receiving devices, and circuit devices, for example.

For example, as shown in FIG. 19, the device 60 may include a function section 21, and a metallic layer 22 that is provided on the undersurface of the function section 21. In other words, the device 60 is equivalent to a device in which the solder bump 23 is removed in the device 20 in the above-described first embodiment.

[Manufacturing Method]

Next, description is provided on an example of a method of manufacturing the mounting substrate 2.

Figure 21:
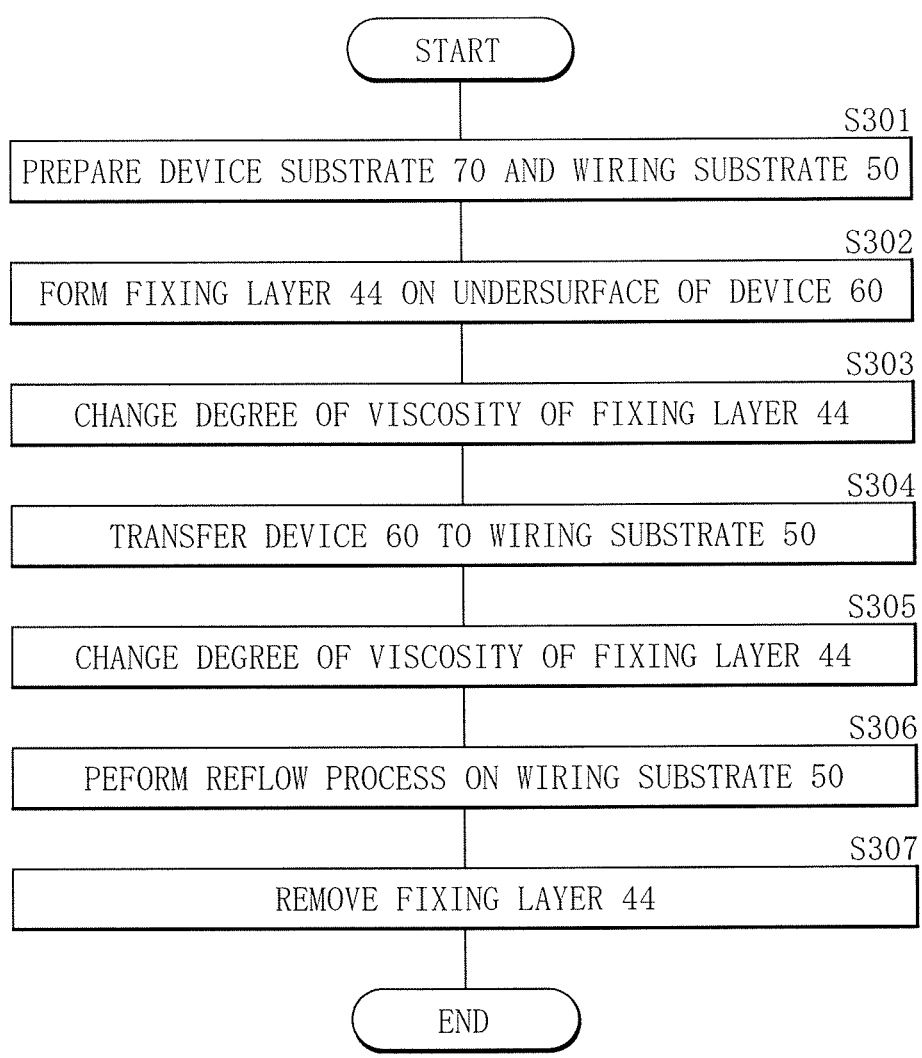
FIG. 21 is a flowchart showing an example of a manufacturing process of the mounting substrate illustrated in FIG. 19.

FIG. 21 shows an example of a manufacturing process for the mounting substrate 2 using a flowchart. Each of FIG. 22 to FIG. 28 shows an example of a manufacturing process for the mounting substrate 2 using a cross-sectional view. First, the device substrate 70 and the wiring substrate 50 are prepared (step S301, FIG. 22 and FIG. 23).

Figure 22:
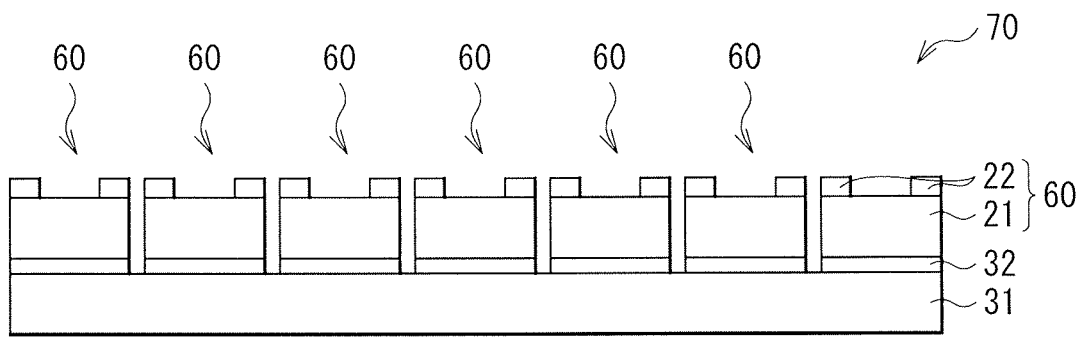
FIG. 22 is a cross-sectional view showing an example of a configuration of a device substrate.

For example, as shown in FIG. 22, the device substrate 70 may include a support substrate 31, a fixing layer 32, and the plurality of devices 60. The device 60 is equivalent to a device in which the solder bump 23 is removed in the device 20 in the above-described first embodiment. Therefore, the device substrate 70 is equivalent to a substrate in which the solder bump 23 is removed in the device substrate 30 in the above-described first embodiment.

Figure 24:
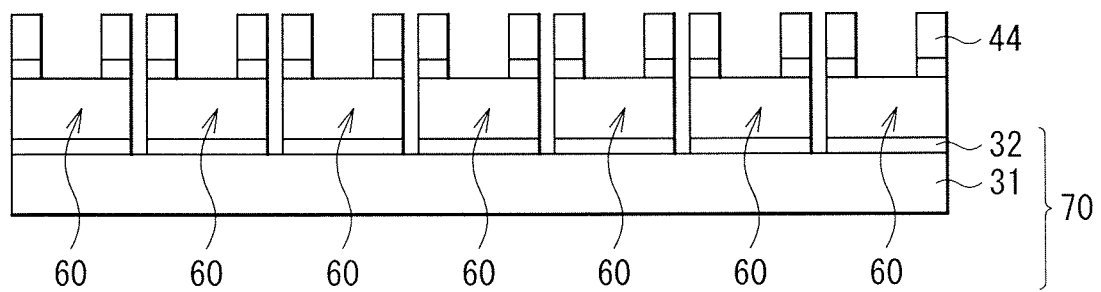
FIG. 24 is a cross-sectional view showing a process following on the process shown in FIG. 23.

Next, a fixing layer 44 is formed on the undersurface of each of the devices 60 (step S302, FIG. 24). In concrete terms, the fixing layer 44 is formed on a top end of the electrically-conductive protrusion that is configured of the metallic layer 22. It is to be noted that the fixing layer 44 may be formed only on the undersurface of the device 60 to be transferred among the plurality of devices 60 on the device substrate 70. The fixing layer 44 accepts each of the devices 60 at the time of the transfer process, while holding one or more of the transferred devices 60 using an adhesive force. More specifically, the fixing layer 44 is a flux. The flux is the same as the flux of the fixing layer 43 that is used in the modification example of the above-described first embodiment.

For example, by the use of a method such as a dip method, a spray method, and printing, the flux is applied with a small and uniform thickness on the top end of the electrically-conductive protrusion. Therefore, at this time, the flux has a low degree of viscosity suitable for coating.

Subsequently, the degree of viscosity of the fixing layer 44 on the device substrate 70 is changed (step S303). For example, using at least one method of heating, decompression, light irradiation, and addition of curing agent, a process is carried out that raises the degree of viscosity of the flux applied on the top surface of the device substrate 70. The degree of the viscosity of the fixing layer 44 is changed after the fixing layer 44 is formed on the device substrate 70 and before the transfer process to be hereinafter described is performed. One reason for this is that the optimum degree of viscosity desired for the fixing layer 44 when the fixing layer 44 is applied on the device substrate 70 is different from that when the fixing layer 44 accepts each of the devices 60 at the time of the transfer process. More specifically, when the fixing layer 44 is formed on the device substrate 70, the degree of the viscosity of the fixing layer 44 may be preferably relatively low, and may be preferably relatively high at the time of the transfer process. A specific method of changing the degree of viscosity is similar to the above-described method. It is to be noted that, in an embodiment where the optimum degree of viscosity desired for the fixing layer 44 when the fixing layer 44 is applied on the device substrate 70 is not significantly different from that when the fixing layer 44 accepts each of the devices 60 at the time of the transfer process, when the fixing layer 44 is applied on the device substrate 70, this step may be omitted.

Figure 26:
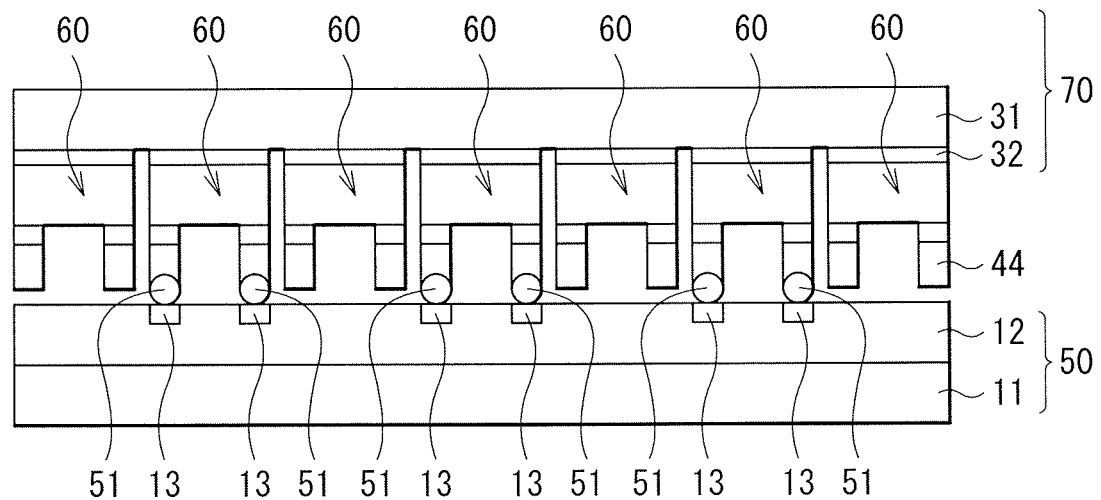
FIG. 26 is a cross-sectional view showing a process following on the process shown in FIG. 25.
Figure 27:
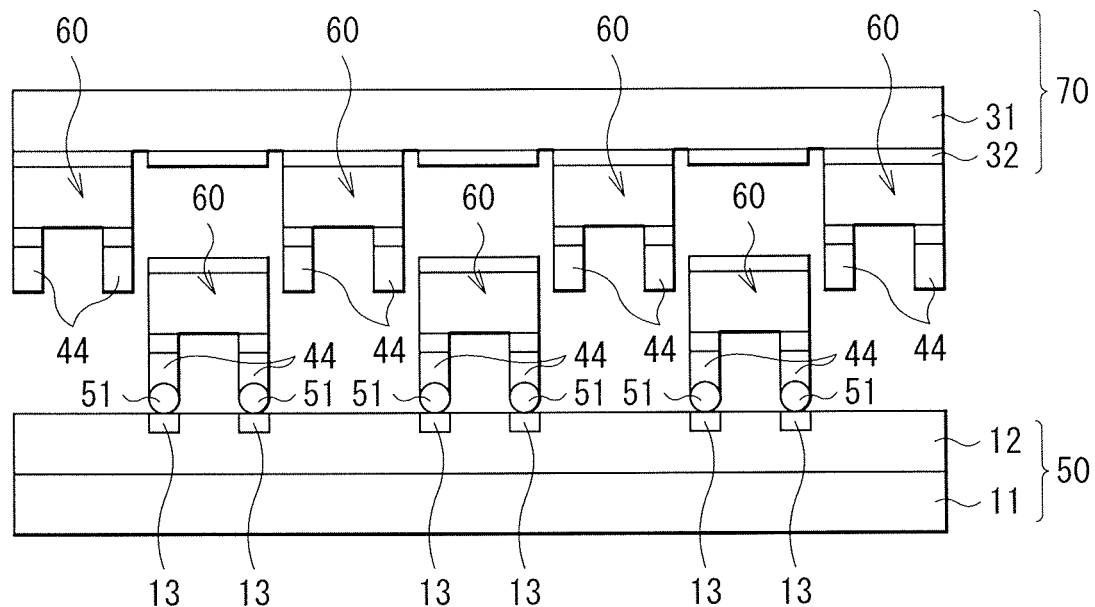
FIG. 27 is a cross-sectional view showing a process following on the process shown in FIG. 26.

Thereafter, part or all of the plurality of devices 60 on the device substrate 70 are transferred on the wiring substrate 50 (step S304). First, the device substrate 70 and the wiring substrate 50 are attached to a transfer apparatus. Next, the device substrate 70 and the wiring substrate 50 are arranged in opposition to each other with a predetermined vacant space 53 interposed between (that is, with them placed away from each other) (FIG. 25) or with them closely-attached to each other (FIG. 26). This temporarily fixes the transferred devices 60 on the wiring substrate 50 with the use of the fixing layer 44. At this time, the fixing layer 44 that is provided on the device 60 to be not transferred may not be preferably in contact with the mounting surface of the wiring substrate 50 (the top surface of the insulating layer 12). It is to be noted that, when the fixing layer 44 is formed only on the undersurface of the device 60 to be transferred among the plurality of devices 60 on the device substrate 70, only the fixing layer 44 that is provided on the device 60 to be transferred comes in contact with the mounting surface of the wiring substrate 50 (the top surface of the insulating layer 12). Subsequently, one or more of the plurality of devices 60 on the device substrate 70 are transferred on the wiring substrate 50 using, for example, a laser ablation method (FIG. 27). It is to be noted that such a transfer process may be carried out in a method other than the laser ablation.

After the transfer process, the whole metallic layer 22 or a part thereof and the metallic layer 13 are opposed to each other with the solder bump 23 in between. Further, when viewed from a direction of a normal to the mounting surface of the wiring substrate 50, it is enough that a portion where the metallic layer 22 and the metallic layer 13 are opposed to each other has an area at least about a half as large as the area of the metallic layer 22. Therefore, it is enough that this transfer process has the accuracy that allows such a transfer to be achieved.

Afterward, the degree of the viscosity of the fixing layer 44 on the wiring substrate 50 is changed (step S305). For example, by heating (post-baking), a process is carried out that raises the degree of viscosity of the flux on the wiring substrate 50. The degree of the viscosity of the fixing layer 44 is changed after the transfer is completed and before the reflow process to be hereinafter described is performed. One reason for this is that the optimum degree of viscosity desired for the fixing layer 44 when the fixing layer 44 accepts each of the devices 60 at the time of the transfer process is slightly different from that when the reflow process is performed. More specifically, when the reflow process is carried out, the degree of the viscosity of the fixing layer 44 may be preferably higher than that at the time of the transfer process. A specific method of changing the degree of viscosity is similar to the above-described method. It is to be noted that this step is intended to prevent each of the transferred devices 60 from shifting during a period of time before the reflow process is performed or during the reflow process. Therefore, this step may be omitted when there is no such a possibility.

Subsequently, a reflow process is carried out for the wiring substrate 50 (step S306, FIG. 28). At this time, the solder bump 23 is melted or softened, and thus the metallic layer 22 and the metallic layer 13 are opposed to each other or are exactly face to face with each other due to a self-alignment function of the solder bump 23. Further, an electrical connection between the transferred device 60 (or the metallic layer 22) and the wiring substrate 50 (or the metallic layer 13) is made as a consequence of melting or softening of the solder bump 23. In other words, the transferred device 60 (or the metallic layer 22) and the wiring substrate 50 (or the metallic layer 13) are electrically connected with each other via the electrically-conductive protrusion (the solder bump 23). After the reflow process, the solder bump 23 is solidified, and accordingly, each of the devices 60 is fixed with high accuracy at a predetermined position on the support substrate 11.

Finally, the fixing layer 44 is removed (cleaned) (step S307). Here, it is sufficient that the flux used as the fixing layer 44 is dissolved, and any residual material is eliminated. A cleaning agent suitable for the flux may be used. At this time, it is possible to remove any material (dirt) attached on the mounting surface of the wiring substrate 50, such as a residue that may be generated from the laser ablation, in conjunction with the cleaning of the flux. It is to be noted that, when the flux is a non-cleaning type, removal of the fixing layer 44 may be omitted.

Next, description is provided on the effects of the method of manufacturing the mounting substrate 2.

In this embodiment of the present application, the electrical connection between the transferred device 60 and the wiring substrate 50 is made by performing a reflow process on the wiring substrate 50 in a state where the transferred device 60 is temporarily fixed to the wiring substrate 50 with the use of the fixing layer 44. This makes it possible to omit a step of burying a vacant space between the devices 60 to flatten a surface on which the wiring layer is formed, or a step of forming the wiring layer, in order to make the electrical connection between the device 60 and the wiring. As a result, it is possible to simplify steps following on the transfer process.

Figure 25:
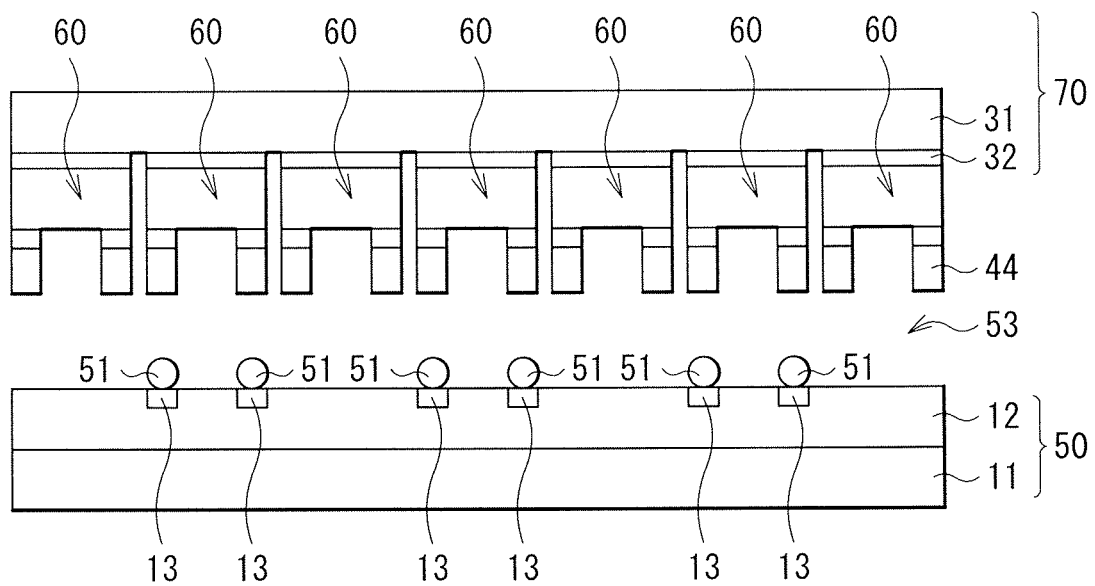
FIG. 25 is a cross-sectional view showing a process following on the process shown in FIG. 24.

Further, as shown in FIG. 25, when a non-contact transfer (proximity transfer) is carried out, the non-transferred device does not come in contact with the fixing layer 44. Therefore, a part of the fixing layer 44 or a residue that may be generated from the laser ablation is not attached to the non-transferred device. Consequently, there may be no possibility of deterioration in the transfer performance of the non-transferred device. In addition, in the proximity transfer, there may be no necessity for moving the device substrate 70 up and down before or after the transfer process, which allows the transfer processing time to be shortened. Moreover, in the proximity transfer, the device substrate 70 and the wiring substrate 50 do not come in contact with each other. As a result, when there is slight unevenness on the surface (mounting surface) of the wiring substrate 50, or there is slight waviness on the device substrate 70, the wiring substrate 50, and/or the like, it is possible to avoid damage to each of the devices 60 that could be caused by a contact transfer.

Figure 28:
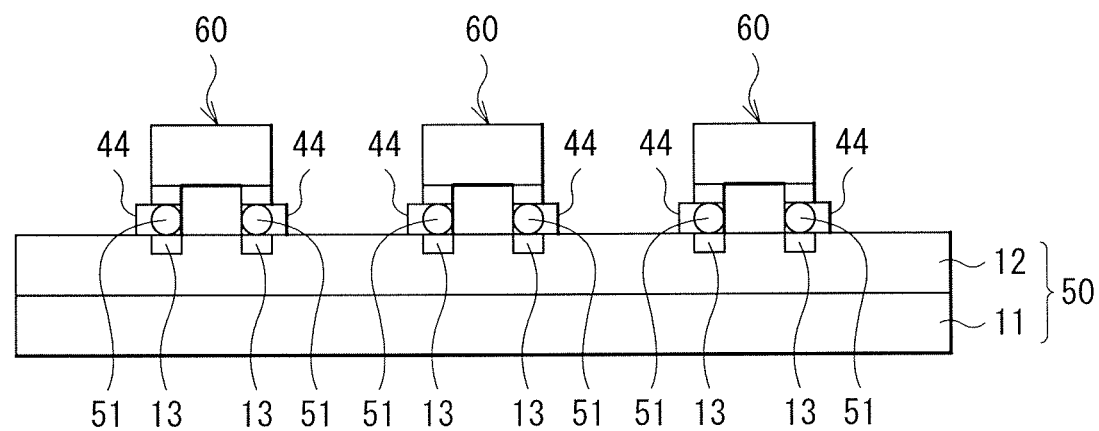
FIG. 28 is a cross-sectional view showing a process following on the process shown in FIG. 27.

In addition, as shown in FIG. 28, when the reflow process is carried out, it is possible to improve the alignment accuracy due to the self-alignment function of a solder. Therefore, there may be no necessity for preparing a high-level adjusting apparatus for improving the alignment accuracy during the transfer process. As a result, this makes it possible to simplify steps during the transfer process, as well as to perform the transfer using inexpensive manufacturing facility. Further, when the electrical connection between the device 60 and the wiring substrate 50 is made using the reflow process, even if a defect in the device 60 is found later, it is possible to take out the defective device 60 with ease. In an existing method of embedding the device 60, it is difficult to take out the defective device 60 with ease.

Moreover, in this embodiment of the present application, the degree of the viscosity of the fixing layer 44 is changed after the fixing layer 44 is applied on the top surface of the device substrate 70 and before the transfer process is performed. This makes it possible to reduce the possibility that a positional shift will occur in each of the devices 60 after the transfer. Further, in this embodiment of the present application, the degree of the viscosity of the fixing layer 44 is changed after the transfer process is performed and before the reflow process is performed. This makes it possible to reduce the possibility that a positional shift will occur in each of the devices 60 immediately before or in the middle of the reflow process.

4. Modification Examples of Second Embodiment

Modification Example 1

Figure 29:
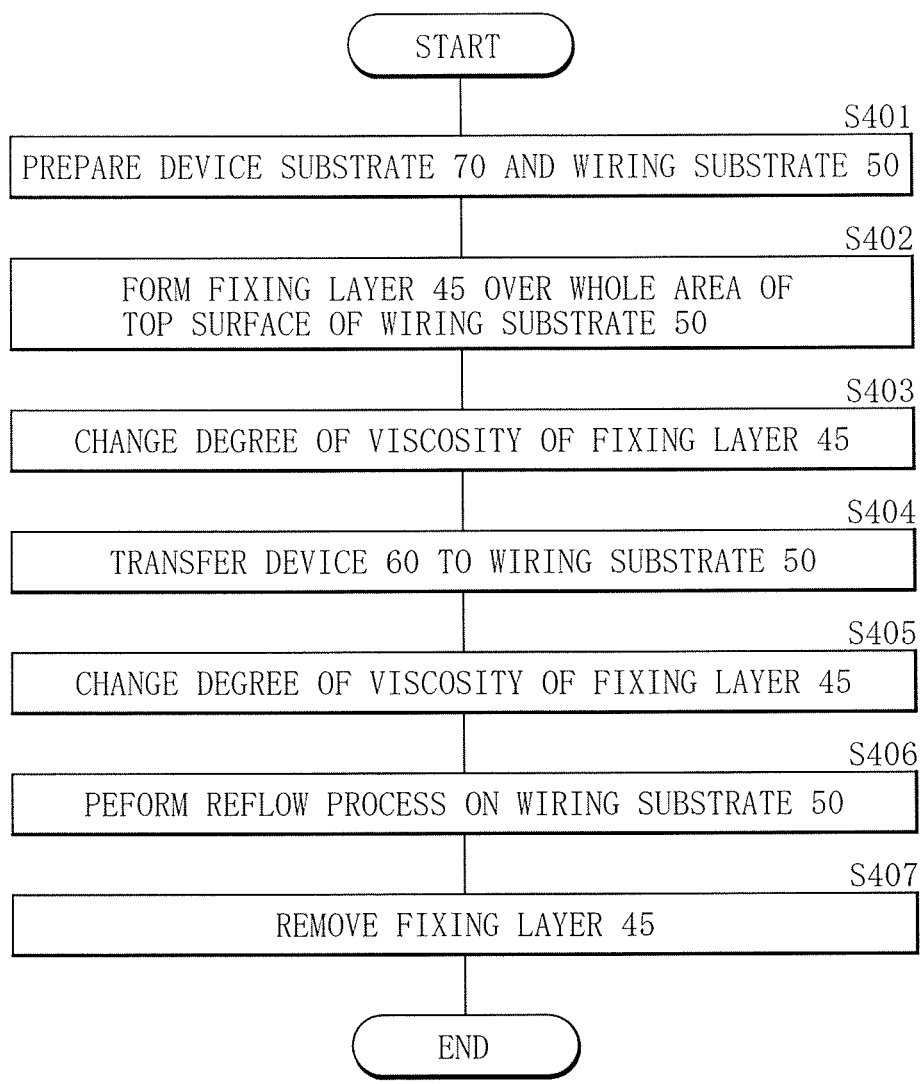
FIG. 29 is a flowchart showing another example of the manufacturing process of the mounting substrate illustrated in FIG. 19.
Figure 30:
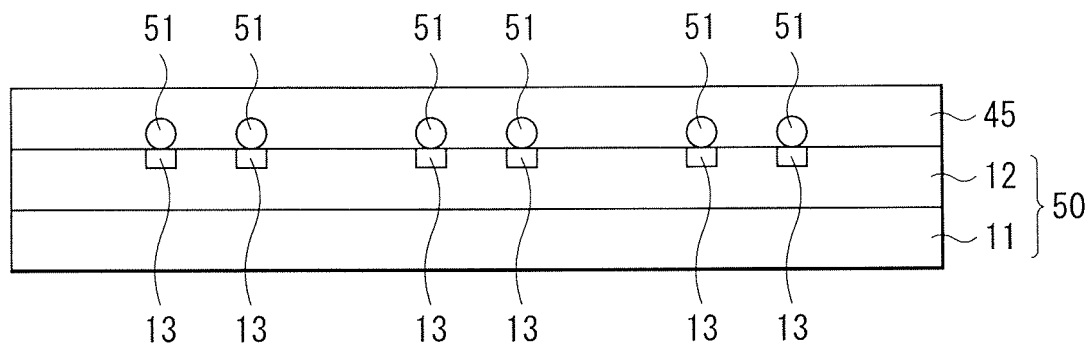
FIG. 30 is a cross-sectional view showing a process following on the process shown in FIG. 24.

Next, description is provided on a modification example of a method of manufacturing the mounting substrate 2 according to the above-described second embodiment of the present application. FIG. 29 shows another example of a manufacturing process for the mounting substrate 2 using a flowchart. Each of FIG. 30 to FIG. 34 shows another example of a manufacturing process for the mounting substrate 2 using a cross-sectional view. In this modification example, a fixing layer 45 is used instead of the fixing layer 44. This fixing layer 45 is applied on the wiring substrate 50.

Figure 23:
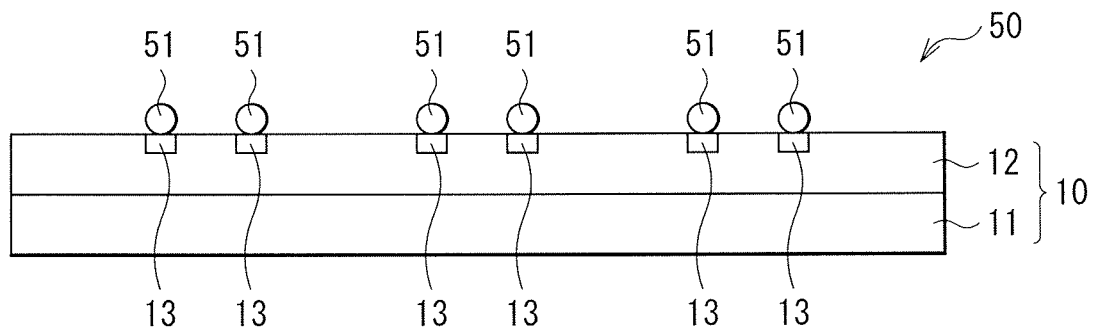
FIG. 23 is a cross-sectional view showing an example of a configuration of a wiring substrate.

First, the device substrate 70 and the wiring substrate 50 are prepared (step S401, FIG. 22 and FIG. 23). Next, the fixing layer 45 is formed over a whole area of the top surface of the wiring substrate 50 (step S402, FIG. 30). It is to be noted that the fixing layer 45 may be alternatively formed only on the top surface of the solder bump 51 or only over a whole surface of the solder bump 51. The fixing layer 45 accepts each of the devices 60 at the time of the transfer process, while holding one or more of the transferred devices 60 using an adhesive force. More specifically, the fixing layer 45 is a flux. The flux is the same as the flux of the fixing layer 41 that is used in the above-described first embodiment of the present application.

For example, by the use of a method such as spin coating, a spray method, a doctor blade method, printing, a transfer method, and an imprinting method, the flux is applied with a small and uniform thickness over a whole area of the top surface of the wiring substrate 50. Therefore, at this time, the flux has a low degree of viscosity suitable for coating.

Subsequently, the degree of the viscosity of the fixing layer 45 on the wiring substrate 50 is changed (step S403). For example, using at least one method of heating, decompression, light irradiation, and addition of curing agent, a process is carried out that raises the degree of viscosity of the flux applied on the device substrate 70. The degree of the viscosity of the fixing layer 45 is changed after the fixing layer 45 is formed on the wiring substrate 50 and before the transfer process to be hereinafter described is performed. One reason for this is that the optimum degree of viscosity desired for the fixing layer 45 when the fixing layer 45 is applied on the top surface of the wiring substrate 50 is different from that when the fixing layer 45 accepts each of the devices 60 at the time of the transfer process. More specifically, when the fixing layer 45 is formed on the wiring substrate 50, the degree of the viscosity of the fixing layer 45 may be preferably relatively low, and may be preferably relatively high at the time of the transfer process. A specific method of changing the degree of viscosity is similar to the above-described method.

Figure 32:
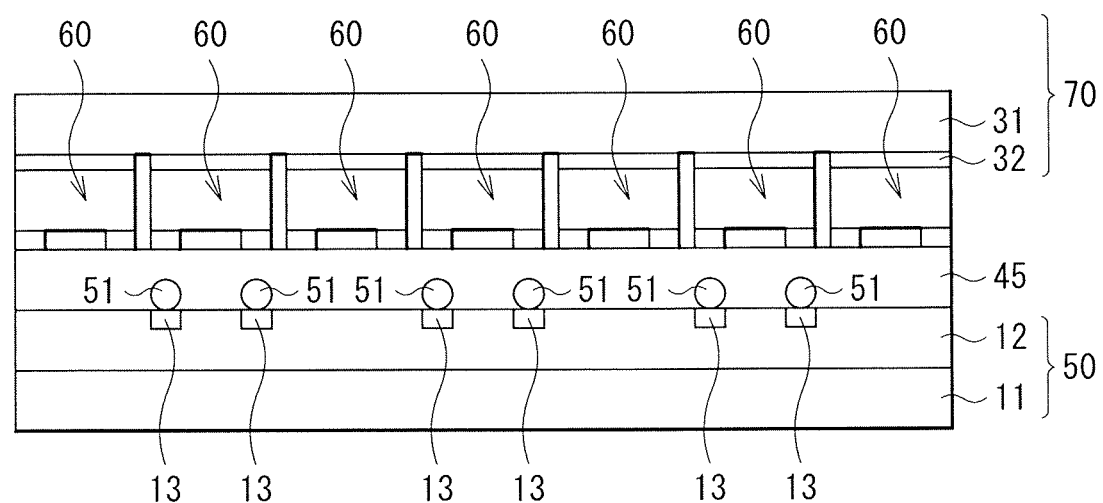
FIG. 32 is a cross-sectional view showing a process following on the process shown in FIG. 31.
Figure 33:
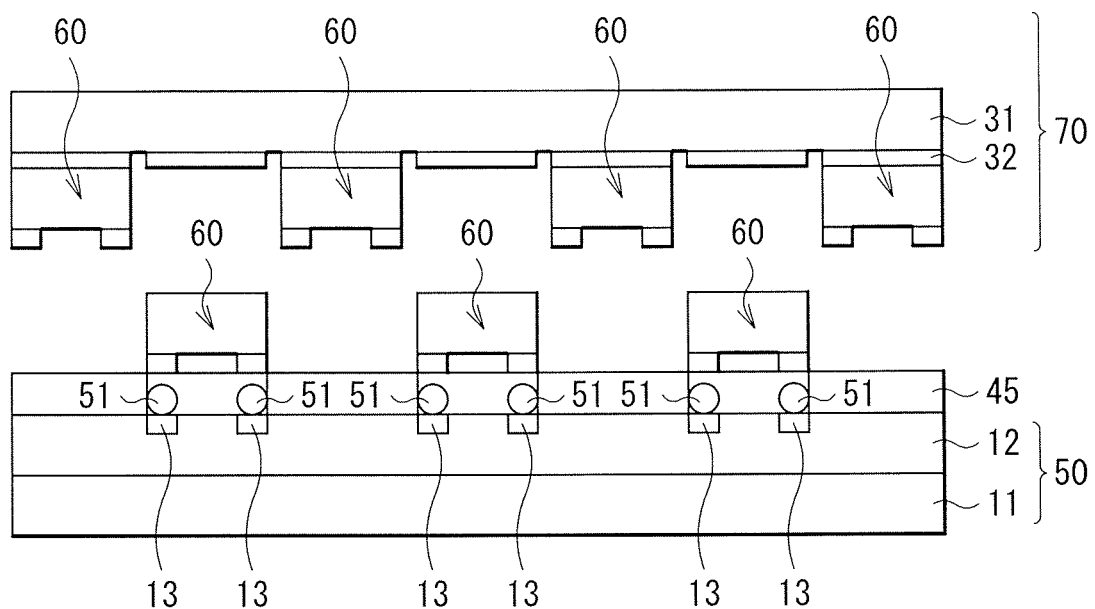
FIG. 33 is a cross-sectional view showing a process following on the process shown in FIG. 32.

Thereafter, part or all of the plurality of devices 60 on the device substrate 70 are transferred on the wiring substrate 50 (step S404). First, the device substrate 70 and the wiring substrate 50 are attached to a transfer apparatus. Next, the device substrate 70 and the wiring substrate 50 are arranged in opposition to each other with a predetermined vacant space 53 interposed between (that is, with them placed away from each other) (FIG. 31) or with them closely-attached to each other (FIG. 32). Subsequently, one or more of the plurality of devices 60 on the device substrate 70 are transferred on the wiring substrate 50 using, for example, a laser ablation method (FIG. 33). This temporarily fixes the transferred device(s) 60 on the wiring substrate 50 with the use of the fixing layer 45. It is to be noted that such a transfer process may be carried out in a method other than the laser ablation.

After the transfer process, the whole metallic layer 22 or a part thereof and the metallic layer 13 are opposed to each other with the solder bump 23 in between. Further, when viewed from a direction of a normal to the mounting surface of the wiring substrate 50, it is enough that a portion where the metallic layer 22 and the metallic layer 13 are opposed to each other has an area at least about a half as large as the area of the metallic layer 22. Therefore, it is enough that this transfer process has the accuracy that allows such a transfer to be achieved.

Afterward, the degree of the viscosity of the fixing layer 45 on the wiring substrate 50 is changed (step S405). For example, by heating (post-baking), a process is carried out that raises the degree of viscosity of the flux coated on the wiring substrate 50. The degree of the viscosity of the fixing layer 45 is changed after the transfer is completed and before the reflow process to be hereinafter described is performed. One reason for this is that the optimum degree of viscosity desired for the fixing layer 45 when the fixing layer 45 accepts each of the devices 60 at the time of the transfer process is slightly different from that when the reflow process is performed. More specifically, when the reflow process is carried out, the degree of the viscosity of the fixing layer 45 may be preferably higher than that at the time of the transfer process. A specific method of changing the degree of viscosity is similar to the above-described method. It is to be noted that this step is intended to prevent each of the transferred devices 60 from shifting during a period of time before the reflow process is performed or during the reflow process. Therefore, this step may be omitted when there is no such a possibility.

Subsequently, a reflow process is carried out for the wiring substrate 50 (step S406, FIG. 34). At this time, the solder bump 23 is melted or softened, and thus the metallic layer 22 and the metallic layer 13 are opposed to each other or are exactly face to face with each other due to a self-alignment function of the solder bump 23. Further, an electrical connection between the transferred device 60 (or the metallic layer 22) and the wiring substrate 50 (or the metallic layer 13) is made as a consequence of melting or softening of the solder bump 23. In other words, the transferred device 60 (or the metallic layer 22) and the wiring substrate 50 (or the metallic layer 13) are electrically connected with each other via the electrically-conductive protrusion (the solder bump 23). After the reflow process, the solder bump 23 is solidified, and accordingly, each of the devices 60 is fixed with high accuracy at a predetermined position on the support substrate 11.

Finally, the fixing layer 45 is removed (cleaned) (step S407). Here, it is sufficient that the flux used as the fixing layer 45 is dissolved, and any residual material is eliminated. A cleaning agent suitable for the flux may be used. At this time, it is possible to remove any material (dirt) attached on the mounting surface of the wiring substrate 50, such as a residue that may be generated from the laser ablation, in conjunction with the cleaning of the flux. It is to be noted that, when the flux is a non-cleaning type, removal of the fixing layer 45 may be omitted.

Next, description is provided on the effects of the method of manufacturing the mounting substrate 2 according to this modification example.

In this modification example, the electrical connection between the transferred device 60 and the wiring substrate 50 is made by performing a reflow process for the wiring substrate 50 in a state where the transferred device 60 is temporarily fixed to the wiring substrate 50 with the use of the fixing layer 45. This makes it possible to omit a step of burying a vacant space between the devices 60 to flatten a surface on which the wiring layer is formed, or a step of forming the wiring layer, in order to make the electrical connection between the device 60 and the wiring. As a result, it is possible to simplify steps following on the transfer process.

Figure 31:
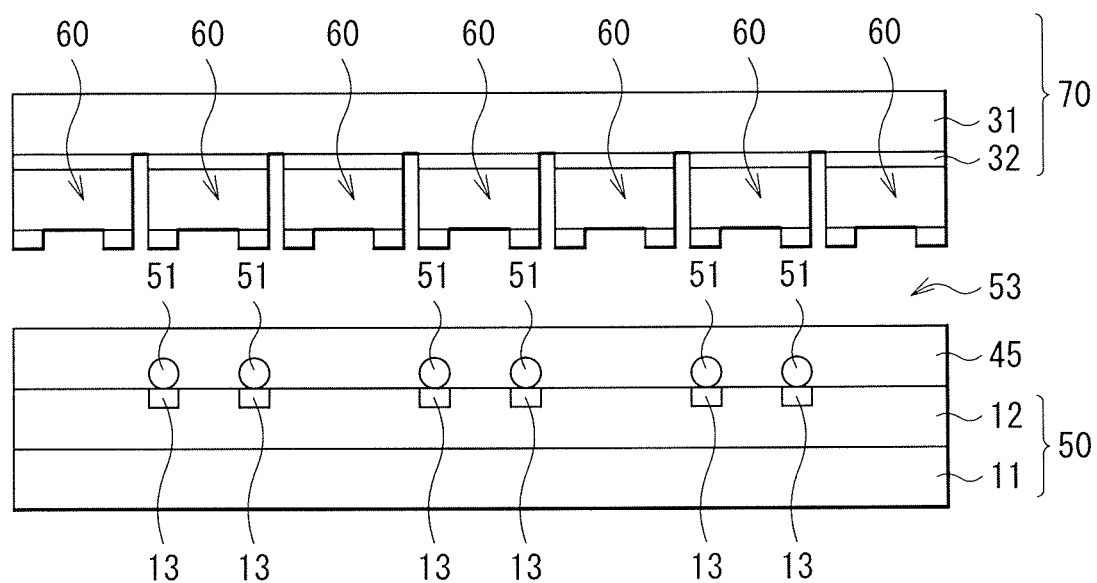
FIG. 31 is a cross-sectional view showing a process following on the process shown in FIG. 30.

Further, as shown in FIG. 31, when a non-contact transfer (proximity transfer) is carried out, the non-transferred device does not come in contact with the fixing layer 45. Therefore, a part of the fixing layer 45 or a residue that may be generated from the laser ablation is not attached to the non-transferred device. Consequently, there may be no possibility of deterioration in the transfer performance of the non-transferred device. In addition, in the proximity transfer, there may be no necessity for moving the device substrate 70 up and down before or after the transfer process, which allows the transfer processing time to be shortened. Moreover, in the proximity transfer, the device substrate 70 and the wiring substrate 50 do not come in contact with each other. As a result, when there is slight unevenness on the surface (the mounting surface) of the wiring substrate 50, or there is slight waviness on the device substrate 70, the wiring substrate 50, and/or the like, it is possible to avoid damage to each of the devices 60 that could be caused by a contact transfer.

Figure 34:
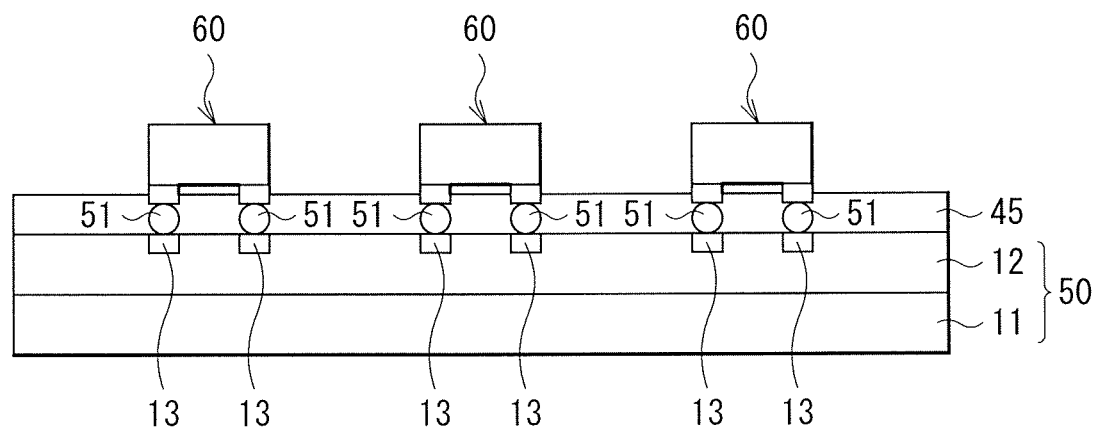
FIG. 34 is a cross-sectional view showing a process following on the process shown in FIG. 33.

In addition, as shown in FIG. 34, when the reflow process is carried out, it is possible to improve the alignment accuracy due to the self-alignment function of a solder. Therefore, there may be no necessity for preparing a high-level adjusting apparatus for improving the alignment accuracy during the transfer process. As a result, it is possible to simplify steps during the transfer process, as well as to perform the transfer using inexpensive manufacturing facility. Further, when the electrical connection between the device 60 and the wiring substrate 50 is made using the reflow process, even if a defect in the device 60 is found later, it is possible to take out the defective device 60 with ease. In an existing method of embedding the device 60, it is difficult to take out the defective device 60 with ease.

Moreover, in this modification example, the degree of the viscosity of the fixing layer 45 is changed after the fixing layer 45 is applied on the top surface of the wiring substrate 50 and before the transfer process is performed. This makes it possible to reduce the possibility that a positional shift will occur in each of the devices 60 after the transfer. Further, in this modification example, the degree of the viscosity of the fixing layer 45 is changed after the transfer process is performed and before the reflow process is performed. This makes it possible to reduce the possibility that a positional shift will occur in each of the devices 60 immediately before or in the middle of the reflow process.

Modification Example 2

Figure 35A:
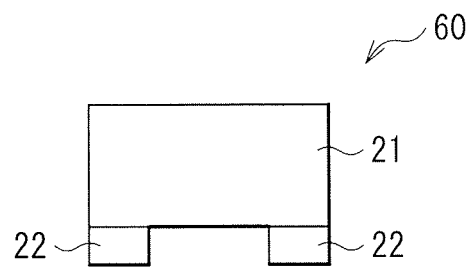
FIG. 35A is a cross-sectional view showing a modification example of the device illustrated in FIG. 19.
Figure 35B:
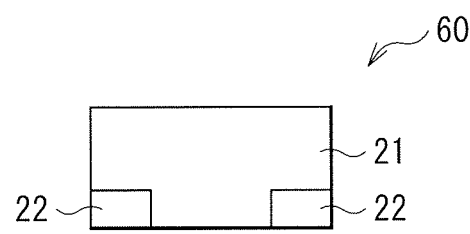
FIG. 35B is a cross-sectional view showing a modification example of the device illustrated in FIG. 19.
Figure 35C:
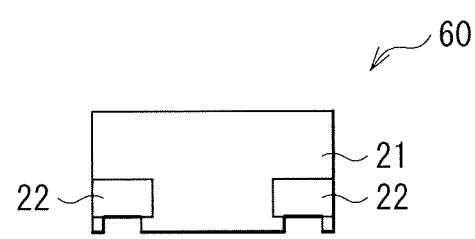
FIG. 35C is a cross-sectional view showing a modification example of the device illustrated in FIG. 19.

Next, description is provided on another modification example of the mounting substrate 2 according to the above-described second embodiment and modification example thereof. In the above-described second embodiment and modification example thereof, for example, as shown in FIG. 35A, the metallic layer 22 is provided on the undersurface of the function section 21, and the whole side surfaces or a part thereof of the metallic layer 22 and the undersurface of the metallic layer 22 are exposed to the outside without being covered by the function section 21. However, for example, as shown in FIG. 35B, the metallic layer 22 may be arranged in such a manner that the undersurface of the metallic layer 22 is in the same or almost the same plane as the undersurface of the function section 21. Further, for example, as shown in FIG. 35C, the metallic layer 22 may be arranged in such a manner that the undersurface of the metallic layer 22 is located at a position recessed from the undersurface of the function section 21. It is to be noted that, in FIG. 35C, a depression is formed on the undersurface of the function section 21 in correspondence with the metallic layer 22, and the undersurface of the metallic layer 22 is exposed at the bottom of the depression.

Figure 36A:
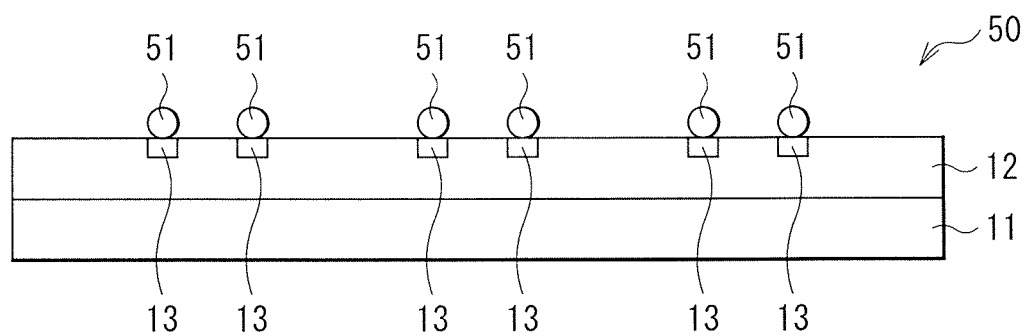
FIG. 36A is a cross-sectional view showing a modification example of the wiring substrate illustrated in FIG. 19.
Figure 36B:
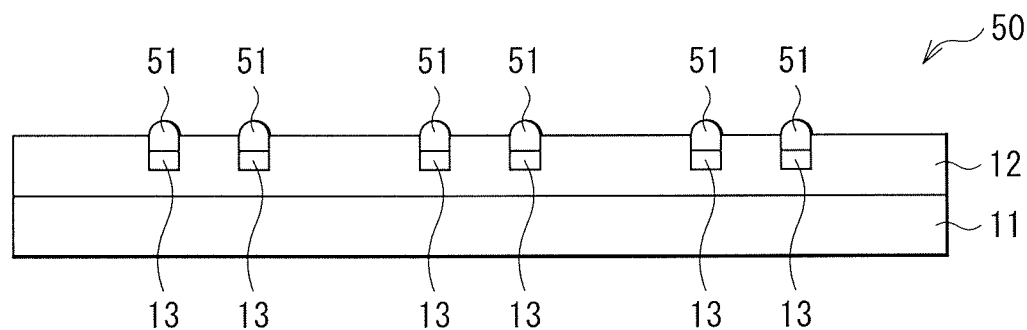
FIG. 36B is a cross-sectional view showing a modification example of the wiring substrate illustrated in FIG. 19.
Figure 36C:
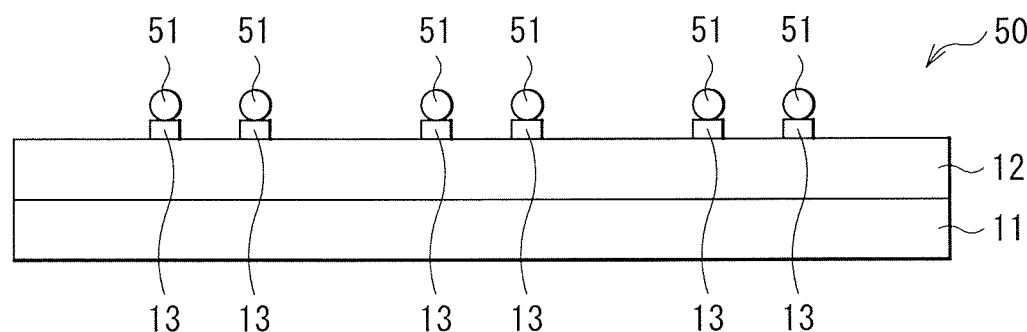
FIG. 36C is a cross-sectional view showing a modification example of the wiring substrate illustrated in FIG. 19.

Further, in the above-described embodiment and modification example thereof, as shown in an example in FIG. 36A, the metallic layer 13 is arranged in such a manner that the top surface of the metallic layer 13 is in the same or almost the same plane as the mounting surface of the wiring substrate 50 (the top surface of the insulating layer 12). However, for example, as shown in FIG. 36B, the metallic layer 13 may be arranged in such a manner that the top surface of the metallic layer 13 is located at a position recessed from the mounting surface of the wiring substrate 50 (the top surface of the insulating layer 12). It is to be noted that, in FIG. 36B, a depression is formed on the mounting surface of the wiring substrate 50 (the top surface of the insulating layer 12) in correspondence with the metallic layer 13, and the top surface of the metallic layer 13 is exposed at the bottom of the depression. Alternatively, for example, as shown in FIG. 36C, the metallic layer 13 may be provided on the mounting surface of the wiring substrate 50 (the top surface of the insulating layer 12), and the whole side surface or a part thereof of the metallic layer 13 and the top surfaces of the metallic layer 13 may be exposed to the outside without being covered by the insulating layer 12.

5. Third Embodiment

Configuration

Figure 37:
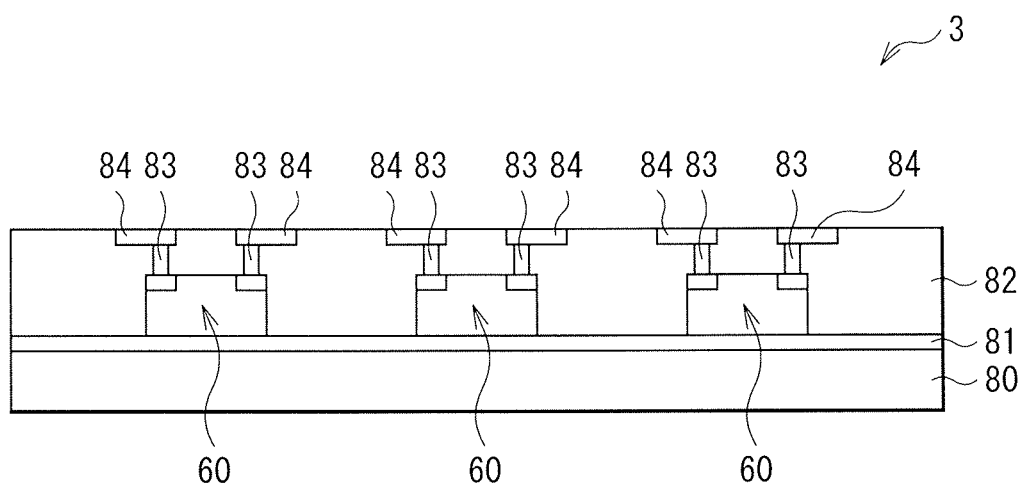
FIG. 37 is a cross-sectional view showing an example of a configuration of a mounting substrate according to a third embodiment of the present application.

Next, the description is provided on a mounting substrate 3 according to a third embodiment of the present application. FIG. 37 shows an example of a cross-sectional configuration of the mounting substrate 3. The mounting substrate 3 is a substrate where a plurality of devices 60 are mounted on a support substrate 80 with a fixing layer 81 in between. The support substrate 80 and each of the devices 60 are electrically separated from each other by the fixing layer 81.

For example, as shown in FIG. 37, the mounting substrate 3 may include the support substrate 80, the fixing layer 81, an insulating layer 82, the plurality of devices 60, a plurality of wires 83, and a plurality of wires 84. The support substrate 80 supports the plurality of devices 60, and may be configured of, for example, a silicon substrate, a glass substrate, a resin substrate, or the like. In the support substrate 80, the surface on the device 60 side is a flat surface. That is, the mounting surface of the support substrate 80 is a flat surface. The fixing layer 81 fixes each of the devices 60 on the support substrate 80. It is to be noted that the fixing layer 81 also accepts each of the devices 60 at the time of the transfer process, and holds one or more of the transferred devices 60 using an adhesive force. The fixing layer 81 may be configured of, for example either an adhesive material or a sticking material. The insulating layer 82 is a layer for burying each of the devices 60 therein and for forming a flat surface on the top surface of the mounting substrate 3, and serves as an interlayer insulating film as well. The insulating layer 82 may be configured of, for example, an insulating material such as polyimide. The wires 83 and 84 are configured to make an electrical connection between each of the devices 60 and an external circuit, and are electrically connected with the metallic layer 22 on each of the devices 60. Each of the devices 60 is arranged on the support substrate 80 with the metallic layer 22 directed upward (that is, with the metallic layer 22 directed toward the opposite side, of the function section 21, from the support substrate 80). Therefore, in each of the devices 60, the function section 21 is connected with the fixing layer 81.

[Manufacturing Method]

Next, description is provided on an example of a method of manufacturing the mounting substrate 3.

Figure 38:
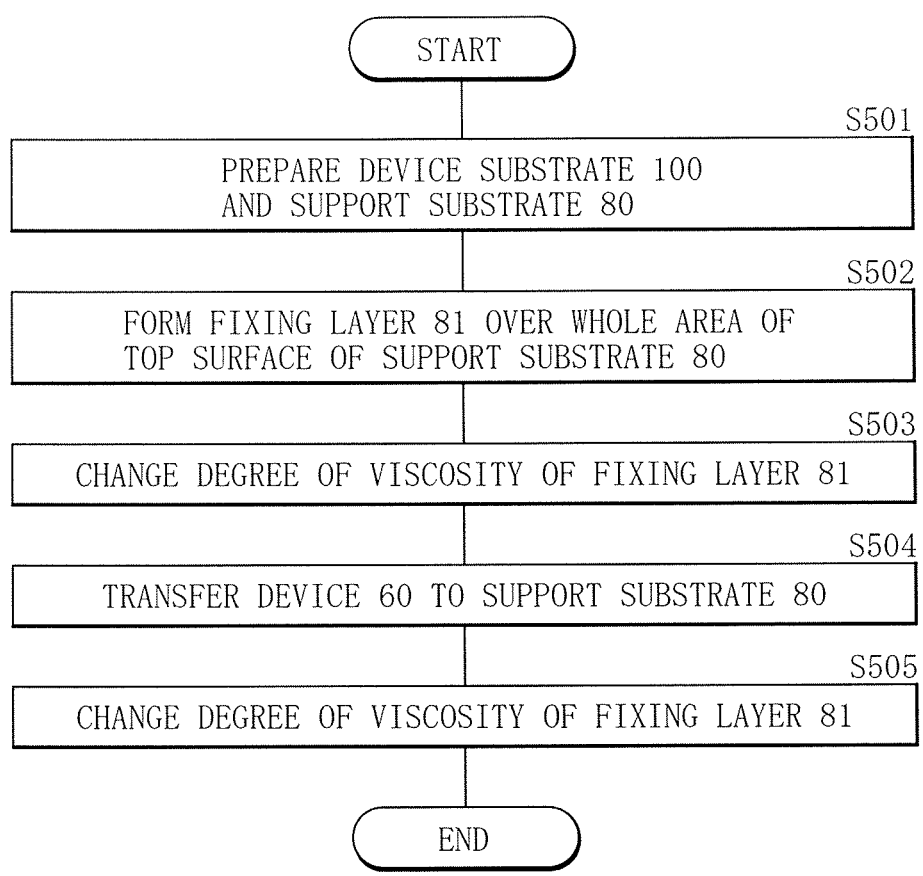
FIG. 38 is a flowchart showing an example of a manufacturing process of the mounting substrate illustrated in FIG. 37.

FIG. 38 shows an example of a manufacturing process for the mounting substrate 3 using a flowchart. Each of FIG. 39 to FIG. 43 shows an example of a manufacturing process for the mounting substrate 3 using a cross-sectional view. First, a device substrate 100 and the support substrate 80 are prepared (step S501, FIG. 39 and FIG. 40).

Figure 39:
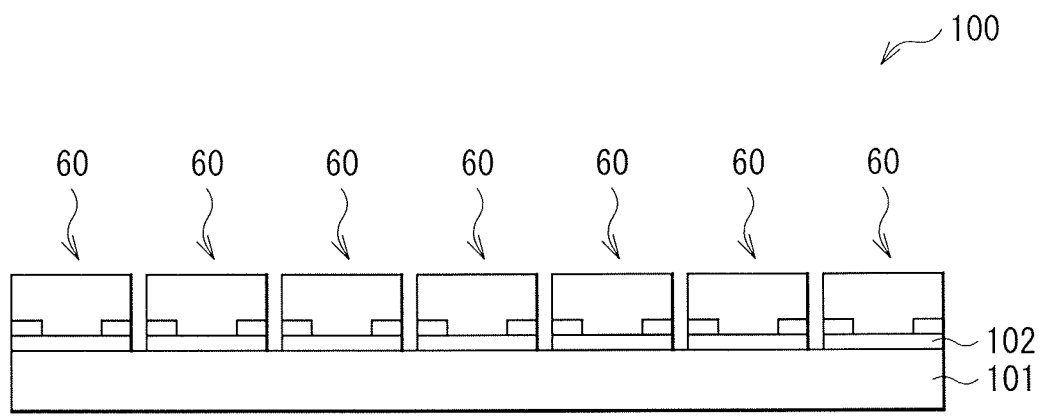
FIG. 39 is a cross-sectional view showing an example of a configuration of a device substrate.
Figure 40:
FIG. 40 is a cross-sectional view showing an example of a configuration of a wiring substrate.

For example, as shown in FIG. 39, the device substrate 100 may include a support substrate 101, a fixing layer 102, and the plurality of devices 60. Each of the devices 60 is arranged on the support substrate 101 with the metallic layer 22 directed downward (that is, with the metallic layer 22 directed toward the support substrate 101 side in relationship with the function section 21). Therefore, in each of the devices 60, the metallic layer 22 is in contact with the fixing layer 102. The support substrate 101 supports the plurality of devices 60, and may be configured of, for example, a silicon substrate, a glass substrate, a resin substrate, or the like. The fixing layer 102 fixes each of the devices 60 on the support substrate 101, and peels off each of the devices 60 from the support substrate 101 at the time of the transfer process. When a transfer is carried out in a laser ablation method, the fixing layer 102 may be configured of, for example, a material that absorbs light at laser oscillation wavelength band. The fixing layer 102 may be formed, for example, over a whole area of the top surface of the support substrate 101. For example, as shown in FIG. 39, the fixing layer 102 may be formed only at a gap between the support substrate 101 and each of the devices 60. Considering the transfer characteristics, as shown in FIG. 39, the fixing layer 102 may be preferably formed for each of the devices 60. Further, considering the simplicity of the process, the fixing layer 102 may be preferably formed over a whole area of the top surface of the support substrate 101. The fixing layer 102 may come in direct contact with the support substrate 101. It is to be noted that an adhesion layer, an insulating layer, a metallic layer, and/or the like may be interposed between the fixing layer 102 and the support substrate 101.

Figure 41:
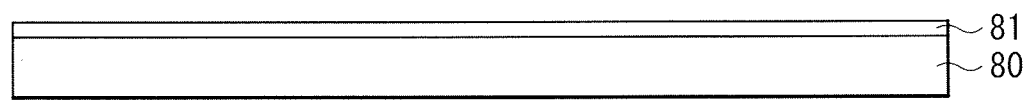
FIG. 41 is a cross-sectional view showing a process following on the process shown in FIG. 40.

Next, a fixing layer 81 is formed over a whole area of the top surface of the support substrate 80 (step S502, FIG. 41). The fixing layer 81 accepts each of the devices 60 at the time of the transfer process, while holding one or more of the transferred devices 60 using an adhesive force. More specifically, the fixing layer 81 is either an adhesive material or a sticking material. Subsequently, the degree of the viscosity of the fixing layer 81 on the support substrate 80 is changed (step S503). For example, using a heating treatment, a process is carried out that raises the degree of viscosity of an adhesive material or a sticking material that is applied on the top surface of the support substrate 80. The degree of the viscosity of the fixing layer 81 is changed after the fixing layer 81 is formed on the top surface of the support substrate 80 and before the transfer process to be hereinafter described is performed. One reason for this is that the optimum degree of viscosity desired for the fixing layer 81 when the fixing layer 81 is applied on the top surface of the support substrate 80 is different from that when the fixing layer 81 accepts each of the devices 60 at the time of the transfer process. More specifically, when the fixing layer 81 is formed on the top surface of the support substrate 80, the degree of the viscosity of the fixing layer 81 may be preferably relatively low, and may be preferably relatively high at the time of the transfer process. When heating is used for changing the degree of viscosity, a solvent contained in the adhesive material or the sticking material is volatized by heating the support substrate 80 using, for example, a hot plate, an atmosphere furnace, an infrared heating furnace, and/or the like to change the degree of viscosity of the adhesive material or the sticking material.

Figure 42:
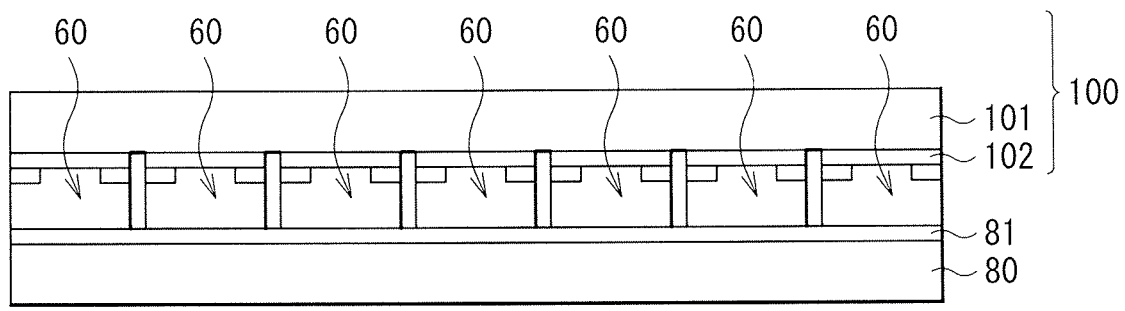
FIG. 42 is a cross-sectional view showing a process following on the process shown in FIG. 41.
Figure 43:
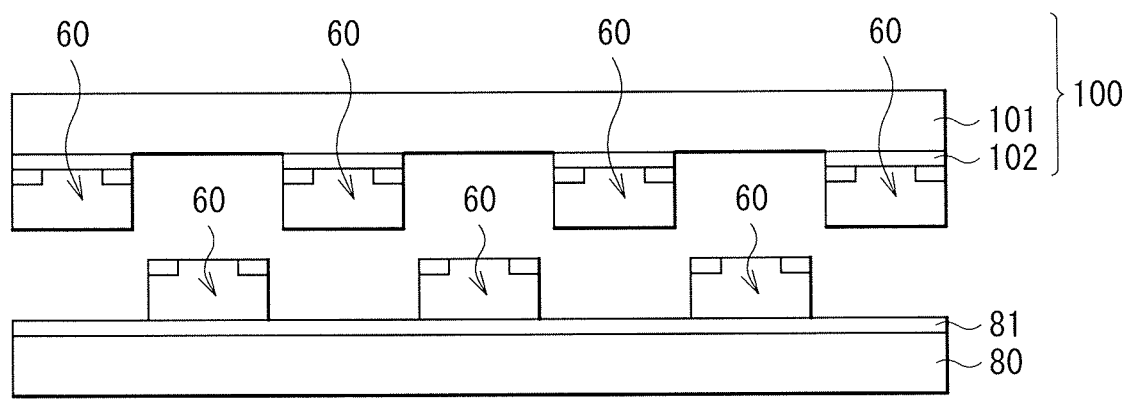
FIG. 43 is a cross-sectional view showing a process following on the process shown in FIG. 42.

Thereafter, part or all of the plurality of devices 60 on the device substrate 100 are transferred on the support substrate 80 (step S504). First, the device substrate 100 and the support substrate 80 are attached to a transfer apparatus. Next, the device substrate 100 and the support substrate 80 are arranged in opposition to each other with them closely-attached to each other (FIG. 42). Subsequently, one or more of the plurality of devices 60 on the device substrate 100 are transferred on the support substrate 80 using, for example, a laser ablation method (FIG. 43). This temporarily fixes the transferred device(s) 60 on the support substrate 80 with the use of the fixing layer 81. It is to be noted that such a transfer process may be carried out in a method other than the laser ablation.

Afterward, the degree of the viscosity of the fixing layer 81 on the support substrate 80 is changed (step S505). For example, using a heating treatment, a process is carried out that raises the degree of viscosity of the adhesive material or the sticking adhesive material that is applied on the top surface of the support substrate 80. The degree of the viscosity of the fixing layer 81 is changed after the transfer is completed and before embedding to be hereinafter described is performed. One reason for this is that the optimum degree of viscosity desired for the fixing layer 81 when the fixing layer 81 accepts each of the devices 60 at the time of the transfer process is slightly different from that when the embedding is performed. More specifically, when the embedding is carried out, the degree of the viscosity of the fixing layer 81 may be preferably higher than that at the time of the transfer process. A specific method of changing the degree of viscosity is similar to the above-described method. It is to be noted that this step is intended to prevent each of the transferred devices 60 from shifting during a period of time before the embedding is performed or during the embedding process. Therefore, this step may be omitted when there is no such a possibility. Finally, each of the devices 60 is embedded to form the insulating layer 82, as well as the wires 83 and 84.

[Effects]

Next, description is provided on the effects of the method of manufacturing the mounting substrate 3.

In this embodiment of the present application, the degree of the viscosity of the fixing layer 81 is changed after the fixing layer 81 is coated on the top surface of the support substrate 80 and before the transfer process is performed. This makes it possible to reduce the possibility that a positional shift will occur in each of the devices 60 after the transfer. Further, in this embodiment, the degree of the viscosity of the fixing layer 81 is changed after the transfer process is performed and before each of the devices 60 is embedded. This makes it possible to reduce the possibility that a positional shift will occur in each of the devices 60 immediately before or in the middle of the embedding.

6. Fourth Embodiment

Configuration

Next, description is provided on an electronic apparatus 4 according to a fourth embodiment of the present application.

Figure 44:
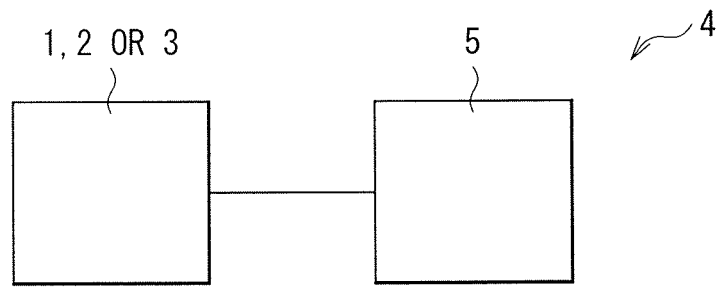
FIG. 44 is a schematic diagram showing an example of a configuration of an electronic apparatus according to a fourth embodiment of the present application.

FIG. 44 shows an example of a simplified configuration of the electronic apparatus 4. The electronic apparatus 4 includes any one of the mounting substrates 1, 2, and 3, and a control section 5 that is electrically connected with the mounting substrate 1, 2, or 3. The control section 5 may be, for example, a circuit that applies a voltage or a current to the mounting substrate 1, 2, or 3, or receives an output from the mounting substrate 1, 2, or 3. In the electronic apparatus 4, the mounting substrate 1, 2, or 3 may serve as, for example, a light-emitting panel, a display panel, or a light-receiving panel due to application of a voltage or a current by the control section 5 to the mounting substrate 1, 2, or 3.

[Manufacturing Method]

Subsequently, description is provided on an example of a method of manufacturing the electronic apparatus 4 including any one of the mounting substrates 1, 2, and 3. First, using any of the methods described in the above-described embodiments and modification examples thereof, the mounting substrate 1, 2, or 3 is formed (for example, see FIG. 3, FIG. 11, FIG. 21, FIG. 29, and FIG. 38). Next, the control section 5 is prepared, and thereafter, the mounting substrate 1, 2, or 3 and the control section 5 are electrically connected with each other. Thus, the electronic apparatus 4 is formed.

[Effects]

Next, description is provided on the effects of the method of manufacturing the electronic apparatus 4.

In this embodiment of the present application, using any of the methods described in the above-described embodiments and modification examples thereof, any one of the mounting substrates 1, 2, and 3 is formed. This makes it possible to use a more inexpensive and easier-to-repair mounting substrate for the electronic apparatus 4 as compared with a mounting substrate that is formed using an existing method.

The present application is described thus far with reference to some embodiments and modification examples thereof. However, the present application is not limited to the above-described embodiments and the like, and various modifications may be made.

Figure 45:
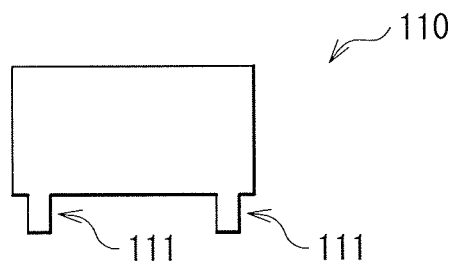
FIG. 45 is a cross-sectional view showing an example of a chip-shaped material.

For example, in the above-described third embodiment, a chip-shaped material may be transferred instead of the device 60. More specifically, in the present application, the device may not necessarily have unique function by itself, and may be configured of, for example, a chip-shaped material. On this occasion, in the device, the surface on the support substrate 81 side may be a flat surface. Further, on this occasion, in the support substrate 81, the mounting surface thereof may be a flat surface. Further, when the device is configured of a chip-shaped material, the device may have one or more protrusions on the surface on the support substrate 81 side. This protrusion has a role (a role as an anchor) that is similar to that of the protrusion in the above-described first embodiment. For example, as shown in FIG. 45, a chip-shaped material 110 may have a plurality of protrusions 111 on the underside thereof (a surface on the support substrate 81 side). In this case, each of the protrusions 111 has a role as an anchor.

Further, for example, it is possible to achieve at least the following configurations from the above-described example embodiments and the modifications of the present application.

(1) A method of manufacturing a mounting substrate, the method including:

transferring part or all of a plurality of devices on a device substrate onto a wiring substrate, and temporarily fixing the transferred devices to the wiring substrate with use of a fixing layer having viscosity, the device substrate including a support substrate and the plurality of devices fixed on the support substrate; and performing a reflow process on the wiring substrate to electrically connect the transferred devices with the wiring substrate, and thereby forming the mounting substrate.

(2) The method according to (1), wherein
each of the devices has one or more first metallic parts on a surface of the device,
the wiring substrate has one or more second metallic parts on a surface of the wiring substrate,
either or both of the first metallic part and the second metallic part has an electrically-conductive protrusion standing out from a surrounding area, and
the first metallic part is electrically connected with the second metallic part via the protrusion through the performing of the reflow process.

(3) The method according to (2), wherein the protrusion includes one or both of a solder bump and a solder diffusion suppression layer.

(4) The method according to (2) or (3), wherein
the first metallic part has the protrusion, and
the first metallic part includes a solder bump serving as the protrusion.

(5) The method according to (4), wherein
the second metallic part also has the protrusion, and
the second metallic part includes a solder diffusion suppression layer serving as the protrusion.

(6) The method according to (4), wherein the second metallic part has no the protrusion, and is provided at a position that is same or lower in height as compared with the surrounding area.

(7) The method according to any one of (1) to (6), further including removing the fixing layer after the reflow process is performed.

(8) The method according to any one of (1) to (7), further including performing a process of raising a degree of viscosity of the fixing layer before the transferring is performed.

(9) The method according to (8), further including performing a process of raising the degree of the viscosity of the fixing layer after the transferring is performed and before the reflow process is performed.

(10) The method according to (8), further including performing the process of raising the degree of the viscosity of the fixing layer by one or more methods out of heating, decompression, light irradiation, and addition of a curing agent.

(11) A method of manufacturing an electronic apparatus, the method including:

transferring part or all of a plurality of devices on a device substrate onto a wiring substrate, and temporarily fixing the transferred devices to the wiring substrate with use of a fixing layer having viscosity, the device substrate including a support substrate and the plurality of devices fixed on the support substrate;

performing a reflow process on the wiring substrate to electrically connect the transferred devices with the wiring substrate, and thereby forming the mounting substrate; and electrically connecting the mounting substrate with a control section, and thereby forming an electronic apparatus.

Also, for example, it is possible to achieve at least the following configurations from the above-described example embodiments and the modifications of the present application.

(12) A method of manufacturing a mounting substrate, the method of manufacturing a mounting substrate where a plurality of devices are mounted on a transfer substrate including:

performing a process of raising a degree of viscosity of a fixing layer having viscosity after coating the fixing layer on a surface of the transfer substrate; and transferring some or all of the plurality of devices on a device substrate where the plurality of devices are fixed on a support substrate on the transfer substrate.

(13) The method according to (12), further including:

performing a process of raising a degree of viscosity of the fixing layer using at least one method of heating, decompression, light irradiation, and addition of curing agent.

(14) The method according to (12) or (13), wherein the fixing layer is any one of a flux, an adhesive material, and a pressure-sensitive adhesive material.

(15) The method according to (12) or (13), wherein the fixing layer is either an adhesive material or a pressure-sensitive adhesive material.

(16) The method according to (12), (13), or (15), wherein in each of the devices, a surface of the transfer substrate is a flat surface, and in the transfer substrate, a mounting surface for each of the devices is a flat surface.

(17) The method according to (16), wherein each of the devices has one or more first metallic parts on a surface on the opposite side of a surface on the transfer substrate side.

(18) A method of manufacturing an electronic apparatus, the method of manufacturing an electronic apparatus provided with a mounting substrate where a plurality of devices are mounted on a transfer substrate including:

performing a process of raising a degree of viscosity of a fixing layer having viscosity after coating the fixing layer on a surface of the transfer substrate; and transferring some or all of the plurality of devices on a device substrate where the plurality of devices are fixed on a support substrate on the transfer substrate.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of manufacturing a mounting substrate, the method comprising:

performing, at a first time, a first viscosity modification process of raising a degree of viscosity of a fixing layer on a wiring substrate, the wiring substrate including a first support substrate, an insulating layer, and metallic parts on a first surface of the insulating layer of the wiring substrate;

after the first viscosity modification process, at a second time, transferring part or all of a plurality of devices on a device substrate onto the wiring substrate by a transfer process, and temporarily fixing the transferred devices to the wiring substrate with use of the fixing layer on the wiring substrate, the device substrate including a second support substrate and the plurality of devices fixed on the second support substrate, each of the transferred devices having one or more conductive protrusions on a surface thereof that are partially embedded in the fixing layer but without contacting the metallic parts of the wiring substrate, each conductive protrusion including a metallic layer and a solder bump;

after the transfer process, performing, at a third time, a second viscosity modification process of further raising the degree of viscosity of the fixing layer by one or more methods selected from the group consisting of decompression, light irradiation, and addition of a curing agent, wherein a thickness of the metallic layer, in a direction of a normal to a second surface of the wiring substrate, is less than a thickness of the fixing layer in a same direction, a thickness of the solder bump, in the same direction, is less than the thickness of the fixing layer in the same direction, and a thickness of the one or more conductive protrusions, in the same direction, is greater than the thickness of the fixing layer in the same direction, the second surface being an interface between the first support substrate and a second surface of the insulating layer, and the thickness of the one or more conductive protrusions is a distance in the same direction from a first tip and a second tip opposite the first tip;

after the second viscosity modification process, performing the reflow process on the wiring substrate to reflow and electrically connect the embedded metallic layer of transferred devices with the metallic parts of the wiring substrate, and thereby forming the mounting substrate; and removing the fixing layer.

2. The method according to claim 1, further comprising performing the first process of raising the degree of the viscosity of the fixing layer by one or more methods selected from the group consisting of heating, decompression, light irradiation, and addition of a curing agent.

3. The method according to claim 1, wherein the second viscosity modification process prevents the transferred plurality of devices from shifting during a period of time before the reflow process.

4. A method of manufacturing an electronic apparatus, the method comprising:

performing, at a first time, a first viscosity modification process of raising a degree of viscosity of a fixing layer on a wiring substrate, the wiring substrate including a first support substrate, an insulating layer, and metallic parts on a first surface of the insulating layer of the wiring substrate;

after the first viscosity modification process, at a second time, transferring part or all of a plurality of devices on a device substrate onto the wiring substrate by a transfer process, and temporarily fixing the transferred devices to the wiring substrate with use of the fixing layer on the wiring substrate, the device substrate including a second support substrate and the plurality of devices fixed on the second support substrate, each of the transferred devices having one or more conductive protrusions on a surface thereof that are partially embedded in the fixing layer but without contacting the metallic parts of the wiring substrate, each conductive protrusion including a metallic layer and a solder bump;

after the transfer process, performing, at a third time, a second viscosity modification process of further raising the degree of viscosity of the fixing layer by one or more methods selected from the group consisting of decompression, light irradiation, and addition of a curing agent, wherein a thickness of the metallic layer, in a direction of a normal to a second surface of the wiring substrate, is less than a thickness of the fixing layer in a same direction, a thickness of the solder bump, in the same direction, is less than the thickness of the fixing layer in the same direction, and a thickness of the one or more conductive protrusions, in the same direction, is greater than the thickness of the fixing layer in the same direction, the second surface being an interface between the first support substrate and a second surface of the insulating layer, and the thickness of the one or more conductive protrusions is a distance in the same direction from a first tip and a second tip opposite the first tip;

after the second viscosity modification process, performing the reflow process on the wiring substrate to reflow and electrically connect the embedded first metallic layer of transferred devices with the metallic parts of the wiring substrate, and thereby forming a mounting substrate;

removing the fixing layer; and forming the electronic apparatus including the mounting substrate.

5. The method according to claim 4, wherein the second viscosity modification process prevents the transferred plurality of devices from shifting during a period of time before the reflow process.

* * * * *